United States Patent
Eken

(10) Patent No.: US 11,349,512 B1
(45) Date of Patent: May 31, 2022

(54) LOGARITHMIC POWER DETECTOR WITH NOISE COMPENSATION

(71) Applicant: ANALOG DEVICES INTERNATIONAL UNLIMITED COMPANY, Limerick (IE)

(72) Inventor: Yalcin Alper Eken, Istanbul (TR)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 17/238,727

(22) Filed: Apr. 23, 2021

(51) Int. Cl.
  *H04B 1/04* (2006.01)
  *H03F 3/19* (2006.01)
  *G01R 21/01* (2006.01)
  *G01R 19/02* (2006.01)
  *H03G 3/30* (2006.01)

(52) U.S. Cl.
  CPC ............... *H04B 1/04* (2013.01); *H03F 3/19* (2013.01); *H03F 2200/451* (2013.01)

(58) Field of Classification Search
  None
  See application file for complete search history.

(56) References Cited

U.S. PATENT DOCUMENTS

| | | | | |
|---|---|---|---|---|
| 5,521,542 A | * | 5/1996 | Kimura | H03G 7/001 327/351 |
| 5,631,594 A | | 5/1997 | Kimura | |
| 6,730,909 B2 | * | 5/2004 | Butler | H04N 5/2176 250/339.04 |
| 7,342,431 B2 | * | 3/2008 | Zou | G01R 19/02 327/356 |
| 8,461,923 B2 | * | 6/2013 | Eken | H03G 3/3042 330/279 |
| 8,581,574 B2 | * | 11/2013 | Eken | H03G 7/001 324/140 R |
| 9,625,498 B2 | * | 4/2017 | Eken | H04B 17/30 |
| 2005/0111587 A1 | * | 5/2005 | Abe | H04B 1/30 375/324 |

(Continued)

OTHER PUBLICATIONS

*High Frequency Log Amps—Multistage Log Amps*, MT-078 Tutorial, Analog Devices, Rev.0, Oct. 2008, WK, 7 pages.

(Continued)

*Primary Examiner* — Pablo N Tran
(74) *Attorney, Agent, or Firm* — Patent Capital Group

(57) ABSTRACT

An example log power detector includes a gain or attenuation circuit and a detector circuit. The gain or attenuation circuit includes a plurality of gain or attenuation elements arranged in a sequence, each gain or attenuation element configured to generate an output signal that is an amplified or attenuated version of an input signal provided thereto. The detector circuit includes a plurality of detectors, each detector configured to receive the output signal from a different one of the gain or attenuation elements and to generate a signal indicative of a power of the received output signal. At least the last detector is configured to receive a DC offset signal that is different from a DC offset signal received by at least one other detector. Such a log detector may provide effective noise compensation to reduce errors caused by input noise, especially for low-power and/or high-frequency input signals.

20 Claims, 14 Drawing Sheets

(56) References Cited

U.S. PATENT DOCUMENTS

2019/0253030 A1   8/2019 Eken
2020/0003875 A1   1/2020 Eken et al.

OTHER PUBLICATIONS

*Low Cost, DC to 500 MHz, 92 dB Logarithmic Amplifier*, AD8307, Analog Devices © 1997-2019, Rev. F, 24 pages.
Nash, *Measuring VSWR and Gain in Wireless Systems*, Microwave Journal, Nov. 2005, 5 pages.
*1 MHz to 8 GHz, 70 dB, Logarithmic Detector/Controller*, AD8318, © 2004-2017 Analog Devices, Inc., Rev. D, 24 pages.
*Fast, Voltage-Out, DC to 440 MHz, 95 dB Logarithmic Amplifier*, AD8310, © 2005-2010 Analog Devices, Inc., Rev. F, 24 pages.
Schweber, *Log Amps Meet RF Power-Measurement, Signal-Scaling Needs*, © 1995-2021, Digi-Key Electronics, downloaded Feb. 18, 2021, 8 pages.
*LMV221 50-MHz to 3.5-GHz 40-dB Logarithmic Power Detector for CDMA and WCDMA*, Texas Instruments, LMV221, SMWS0160D, Dec. 2006, Revised Jun. 2016, 48 pages.
*1 MHz to 8 GHz, 70 dB, Logarithmic Detector/Controller*, AD8318-EP, © 2012 Analog Devices, Inc., 12 pages.

\* cited by examiner

LOGARITHMIC POWER DETECTOR WITH NOISE COMPENSATION

TECHNICAL FIELD OF THE DISCLOSURE

The present disclosure generally relates to the field of electronic circuits and, more particularly, to power detectors.

BACKGROUND

There are many applications in which it is desirable to measure the average power level of a radio frequency (RF) signal. For example, power measurement and control of RF signals in both the transmitting and receiving chains of modern wireless communications systems, such as cellular telephone networks, may be essential.

High dynamic range power detectors (e.g., those used to detect power greater than about 40 decibels (dB)) typically need to have a logarithmic response to be able to represent the entire dynamic range of input signals with a voltage level that can be used in practical systems. Such power detectors are called "logarithmic power detectors" (also commonly referred to as "log power detectors" or, simply, as "log detectors"). The mathematical relation between the input signal level and the output voltage of a log detector may be as follows:

$$V_{OUT} = V_Y \log\left(\frac{V_{IN}}{V_X}\right),$$

where $V_{IN}$ is the input voltage, $V_{OUT}$ is the output voltage, $V_Y$ is the logarithmic slope, and $V_X$ is the intercept, logarithm taken to the base of 10.

Log detectors can be used in a range applications such as transmit/receive power measurement in wireless communications systems, input protection, return loss measurement, pulse detection, electronic warfare, materials analysis, and medical applications. In general, log detectors can measure signal levels at frequencies from dc to microwave and provide a scaled dc output voltage which is proportional to the log of the input signal. High-frequency log detectors are essential is some applications (e.g., in wireless communications systems). Unfortunately, oftentimes high-frequency log detectors have significant noise that arises from the large bandwidth of input signals, e.g., up to tens of gigahertz (GHz), which may limit the detection dynamic range, elevate the minimum signal floor of the detector, and distort the log-linear characteristics.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DESCRIPTION OF EXAMPLE EMBODIMENTS OF THE DISCLOSURE

Overview

Figure 1:
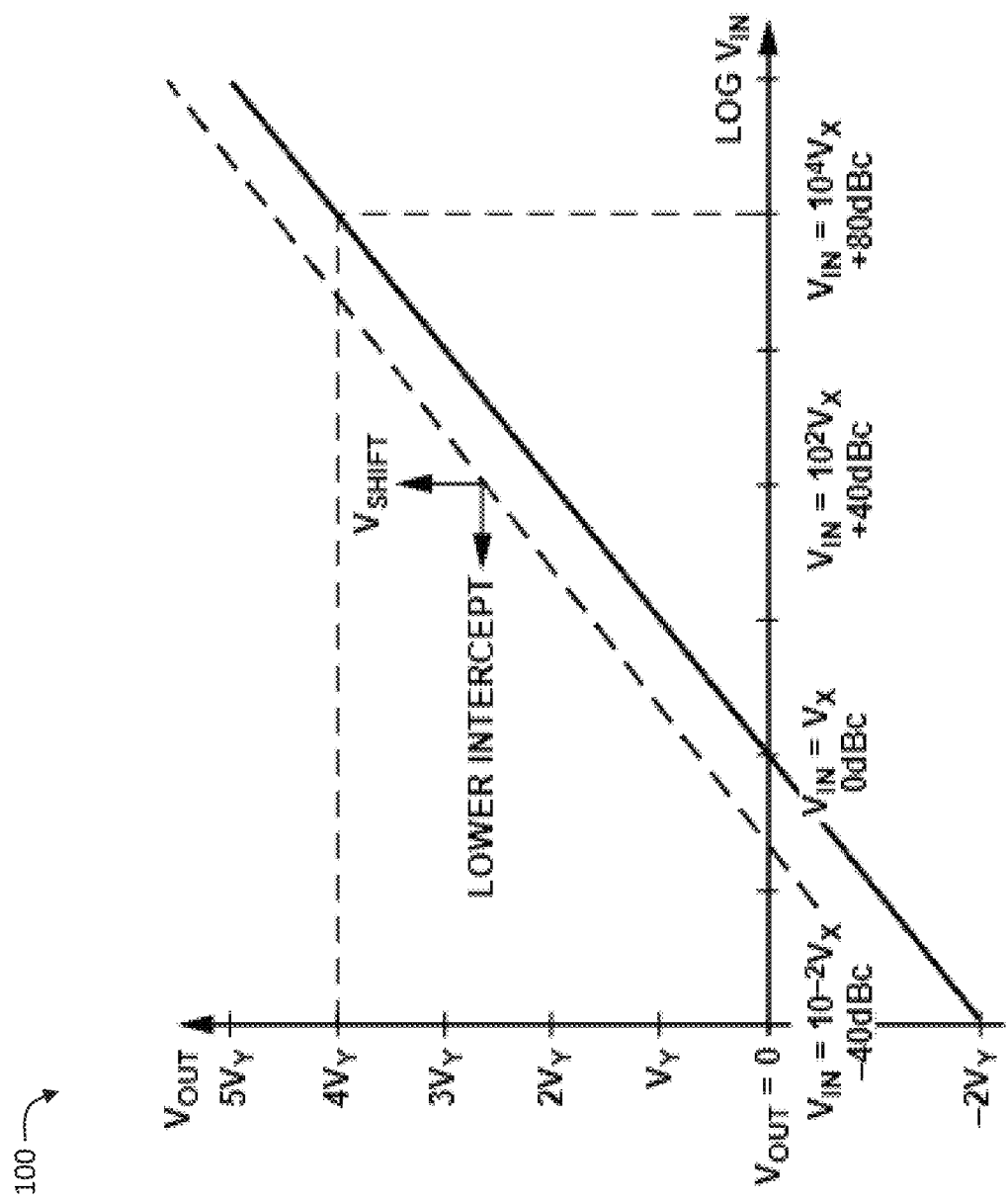
FIG. 1 illustrates a graph showing an input/output relationship of an ideal log detector.

The systems, methods, and devices of this disclosure each have several innovative aspects, no single one of which is solely responsible for all of the desirable attributes disclosed herein. Details of one or more implementations of the subject matter described in this specification are set forth in the description below and the accompanying drawings.

In one aspect of the present disclosure, an example log power detector that includes a gain or attenuation circuit and a detector circuit is described. The gain or attenuation circuit includes a plurality of gain or attenuation elements arranged in a sequence, where each gain or attenuation element is configured to generate an output signal that is an amplified or attenuated version of an input signal provided thereto, and
} where each gain or attenuation element besides a first gain or attenuation element of the sequence is configured to receive the input signal that is based on the output of a previous gain or attenuation element in the sequence. The detector circuit includes a plurality of detectors, where each of the detectors is configured to receive the output signal from a different one of the gain or attenuation elements and to generate a signal indicative of a power of the received output signal, and where at least the last detector (i.e., the detector that is configured to receive the output signal from the last gain or attenuation element of the sequence) is configured to receive a DC offset signal that is different from a DC offset signal received by at least one other detector (some of the other detectors may not receive any DC offset signals, which is considered herein to be equivalent to such detectors receiving a zero DC offset signal). Such a log detector may provide effective noise compensation to reduce or eliminate errors caused by the input noise, especially at the low-end of input signal powers (i.e., especially for input signals with relatively low power) and especially for high-frequency log detectors (i.e., especially for log detectors configured to operate on input signals having relatively high frequencies).

As will be appreciated by one skilled in the art, at least some aspects of the present disclosure, in particular at least some aspects of log power detectors with noise compensation as described herein, may be embodied in various manners, such as a method, a system, a computer program product, or a computer-readable storage medium. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." At least some functions described in this disclosure may be implemented as an algorithm executed by one or more hardware processing units, e.g., one or more microprocessors of one or more computers. In various embodiments, different steps, and portions of the steps, of each of the methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g., to the existing log power detectors and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings, where like reference numerals can indicate identical or functionally similar elements. It will be understood that elements illustrated in the drawings are not necessarily drawn to scale. Moreover, some embodiments can incorporate any suitable combination of features from two or more drawings. Further, it will be understood that certain embodiments can include more elements than illustrated in a drawing and/or a subset of the elements illustrated in a drawing. For example, any of the components (e.g., any of the amplifiers, or any of the transistors) illustrated in the present drawings may be implemented as a plurality of such components which, equivalently, act as a single one of those components described herein. In another example, various circuits and arrangements described herein may include further components that are not specifically illustrated in the present drawings, such as resistors, capacitors, various electrical interconnects (i.e., electrically-conductive structures configured to provide electrical connectivity between various circuit components), etc.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Sometimes, in the present descriptions, the term "circuit" or the term "terminal" may be omitted (e.g., a TTC circuit may be referred to simply as "TTC" and/or various input and output terminals illustrated in the present drawings may be referred to simply as "inputs" and "outputs"). If used, the terms "substantially," "approximately," "about," etc., may be used to generally refer to being within +/−20% of a target value, e.g., within +/−10% of a target value, based on the context of a particular value as described herein or as known in the art.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Other features and advantages of the disclosure will be apparent from the following description and the claims.

Basics of Log Detectors

For purposes of illustrating log power detectors with noise compensation, proposed herein, it might be useful to first understand phenomena that may come into play in logarithmic power detection. The following foundational information may be viewed as a basis from which the present disclosure may be properly explained. Such information is offered for purposes of explanation only and, accordingly, should not be construed in any way to limit the broad scope of the present disclosure and its potential applications.

FIG. 1 illustrates a graph 100 showing an input/output relationship of an ideal log detector. The horizontal axis has a logarithmic scale for indicating $V_{IN}$, spanning a wide dynamic range of 120 decibel (dB). The vertical axis is used for indicating $V_{OUT}$. According to the formula between the input and output voltages of log detectors, provided above, and as is shown in FIG. 1, the output voltage $V_{OUT}$ may be equal to zero when $V_{IN}=V_X$, thus defining the intercept. The incremental gain is inversely proportional to the instantaneous value of the input voltage.

It is typically desirable for log detectors to provide high gain for small input signals and lower gain as the input signal level increases. A well-known log detector architecture is sometimes referred to as "progressive compression" or "successive detection" architecture, an example of which is illustrated in FIG. 2.

Figure 2:
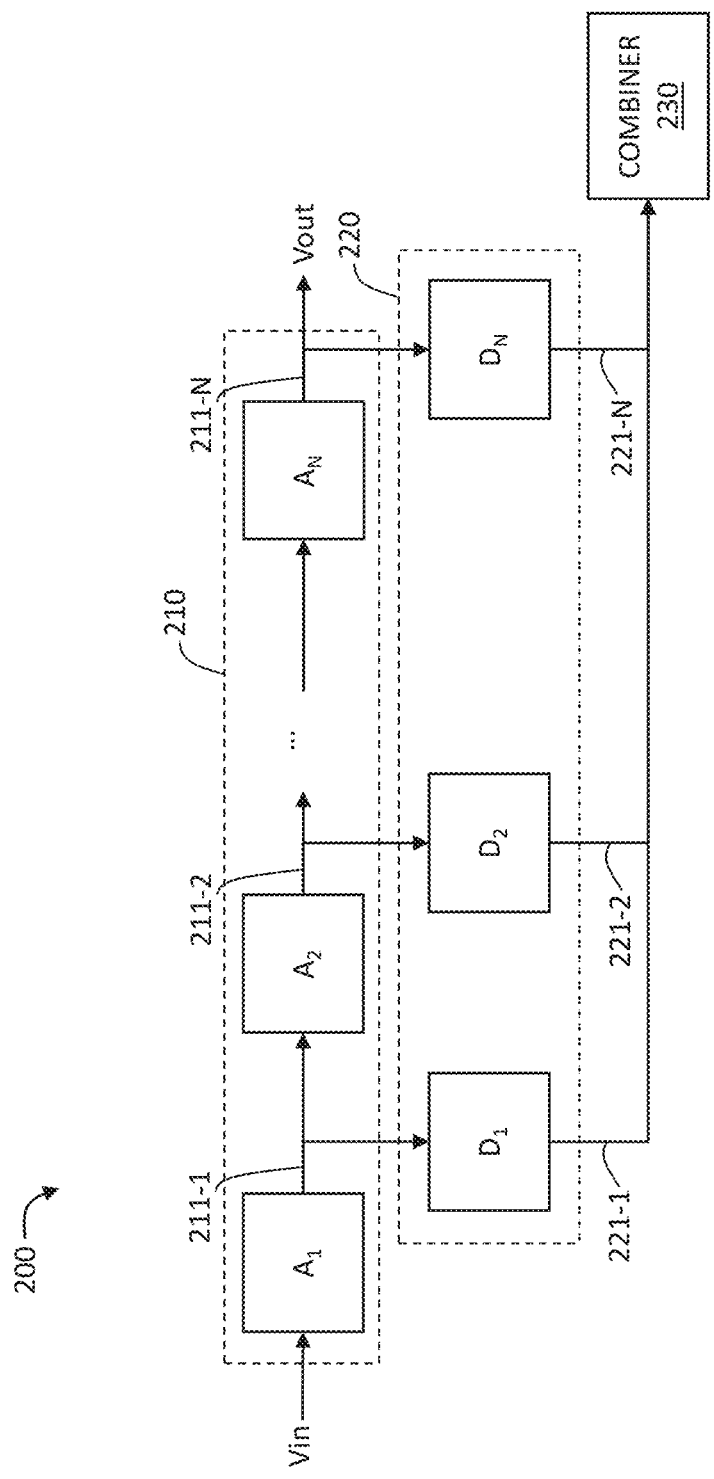
FIG. 2 provides a schematic block diagram illustrating a standard log detector.

FIG. 2 provides a schematic block diagram illustrating a standard log detector 200 with a gain or attenuation circuit 210 and a detector circuit 220. As shown in FIG. 2, the gain or attenuation circuit 210 may include a plurality of gain or attenuation elements, labeled as $A_1$, $A_2$, and so on, until $A_N$, arranged in a sequence. Thus, FIG. 2 illustrates a sequence of N gain or attenuation elements A, where N is any integer greater than one and "A" stands for "amplifier." In the following, descriptions provided with reference to amplifiers are understood to be application to any other types of gain or attenuation elements. FIG. 2 further illustrates that the detector circuit 220 may include a plurality of detectors, shown as N detectors, labeled as $D_1$, $D_2$, and so on, until $D_N$. The log detector 200 may also include a combiner 230.

Each of the amplifiers A of the gain or attenuation circuit 210 may be configured to generate an output signal 211 that is an amplified or attenuated version of an input signal provided thereto. As shown in FIG. 2, the first amplifier $A_1$ may be configured to receive the input voltage $V_{IN}$ and to generate an output signal 211-1 that is an amplified or attenuated version of the input voltage $V_{IN}$, while each of the subsequent amplifiers $A_2$-$A_N$ is configured to receive the input signal that is based on the output of the previous amplifier in the sequence of amplifiers, and generate output signals 211-2 through 211-N that is the amplified or attenuated version of their respective input signals. Thus, the second amplifier $A_2$ may be configured to receive the input voltage that is based on (e.g., is the same as) the output signal 211-1 generated by the first amplifier $A_1$, the third amplifier $A_3$ may be configured to receive the input voltage that is based on an output signal 211-2 generated by the second amplifier $A_2$, and so on, with the last amplifier $A_N$ being configured to receive the input voltage that is based on an output signal 211-(N−1) generated by the one before last amplifier $A_{N-1}$. The output signal 211-N of the last amplifier $A_N$ may then be the output voltage $V_{OUT}$ of the log detector 200.

In turn, each of the detectors of the detector circuit 220 may be configured to receive the output signal from a different one of the amplifiers of the gain or attenuation circuit 210 and to generate a signal 221 indicative of a power of the received output signal. For example, the first detector $D_1$ may be configured to receive the output signal from the first amplifier $A_1$ as an input, and generate a signal 221-1 indicative of the power of the output signal from the first amplifier $A_1$, the second detector $D_2$ may be configured to receive the output signal from the second amplifier $A_2$ as an input, and generate a signal 221-2 indicative of the power of the output signal from the second amplifier $A_2$, the third detector $D_3$ may be configured to receive the output signal from the third amplifier $A_3$ as an input, and generate a signal 221-3 indicative of the power of the output signal from the third amplifier $A_3$, and so on. Each detector of the detector circuit 220 may be a rectifying power detector configured to receive an input RF signal and generate an output indicative of the signal level of the input RF signal. Although not specifically shown in FIG. 2, each detector D may include, or have an output coupled to, an integrator, configured to average the detected signal from the power detector. The detectors D of the detector circuit 220 may be used to demodulate and combine gain taps provided by the amplifiers of the gain or attenuation circuit 210.

The combiner 230 may then combine (e.g., add) outputs 221 of all of the detectors of the detector circuit 220 to generate a signal 231 indicative of a combination of the outputs of the individual detectors. For example, the output 231 may represent an indication of peak power level, e.g., an indication of a mean square power, of the input signal level that is determined by a combination of the gain/attenuation of the input signal by the amplifiers of the gain or attenuation circuit 210 and the dynamic range of the individual detectors of the detector circuit 220.

Figure 4:
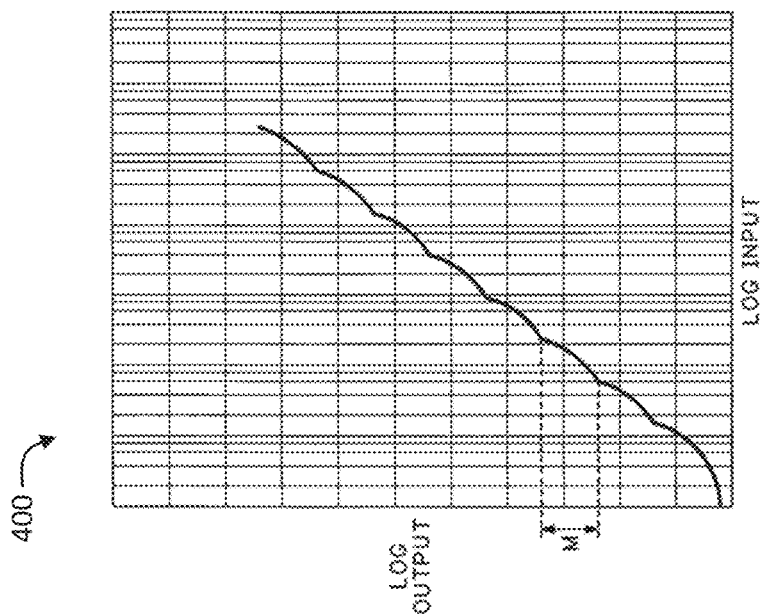
FIG. 4 illustrates a graph showing a combined detector output of the log detector of FIG. 2 as a function of log inputs.
Figure 3:
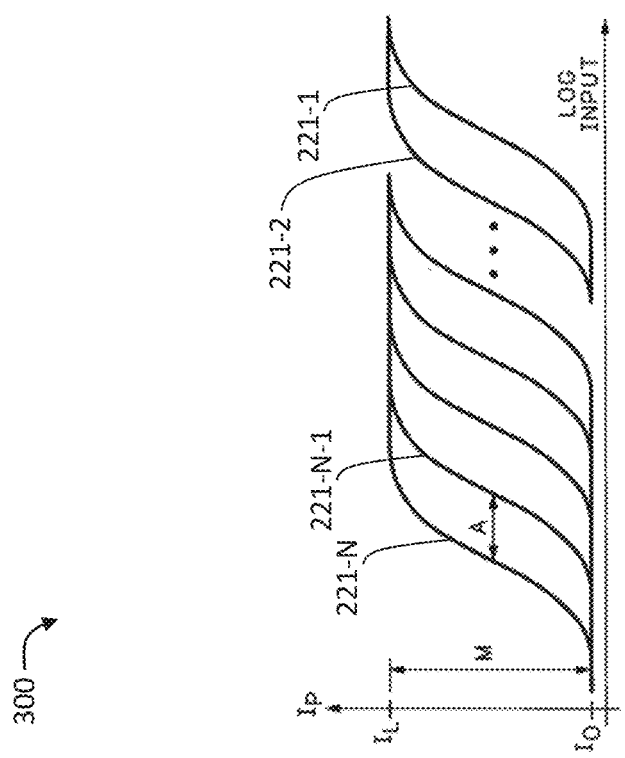
FIG. 3 illustrates a graph showing individual detector outputs of the log detector of FIG. 2 as a function of log inputs.

FIG. 3 illustrates a graph 300 showing individual detector outputs 221 of the log detector 200, as a function of log inputs. FIG. 3 illustrates how, in the log detector 200, individual detector outputs 221-1 to 221-N respond to increasing input signal level with an output level slowly increasing from an initial to current level and saturating at a current level $I_L$. As shown in FIG. 3, the last detector in the chain ($D_N$) of the log detector 200 has the highest gain signal at its input and it will start responding to lowest input signal and saturating first in the chain as the input signal is increased. As the input signal is increased further, the next detector (i.e., the detector immediately preceding the last detector) ($D_{N-1}$) will saturate, and so on, with the first detector ($D_1$) saturating at the highest input signal level. The ratio of input level between the saturation of consecutive detectors (Dm and Dm−1) corresponds to the gain A of the RF amplifiers in the log detector 200. The label "M," shown in FIG. 3, illustrates the difference of the saturated level output of a detector cell (i.e., largest output level of a detector cell) and the no-signal output of the same detector cell (i.e., smallest output level of a detector cell). FIG. 4 illustrates a graph 400 showing a combined detector output (e.g., the output 231 of the combiner 230) of the log detector 200, as a function of log inputs.

Figure 5:
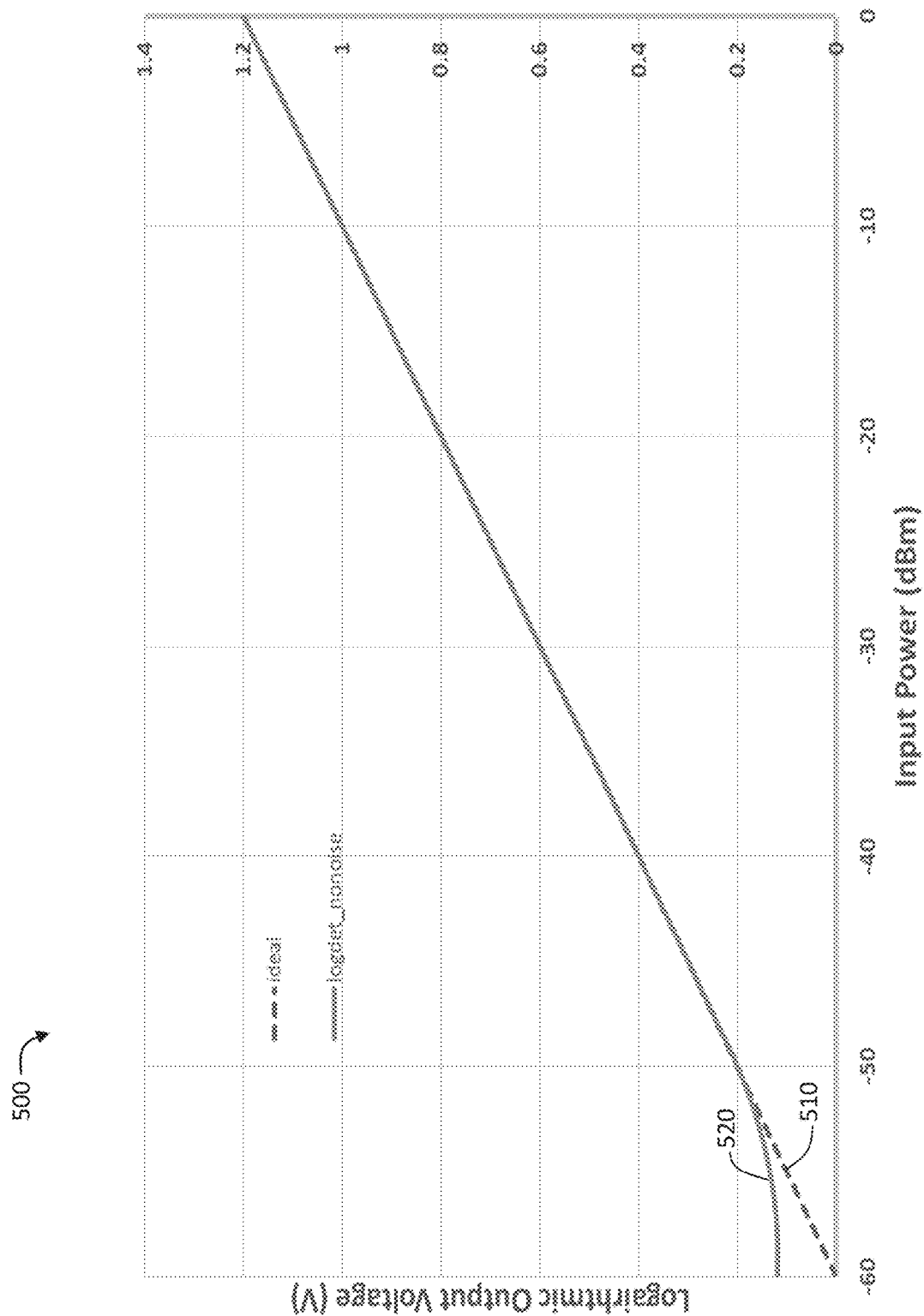
FIG. 5 illustrates a graph showing a logarithmic output voltage of the log detector of FIG. 2 as a function of input power for an idealized scenario without noise at the input of the log detector.
Figure 6:
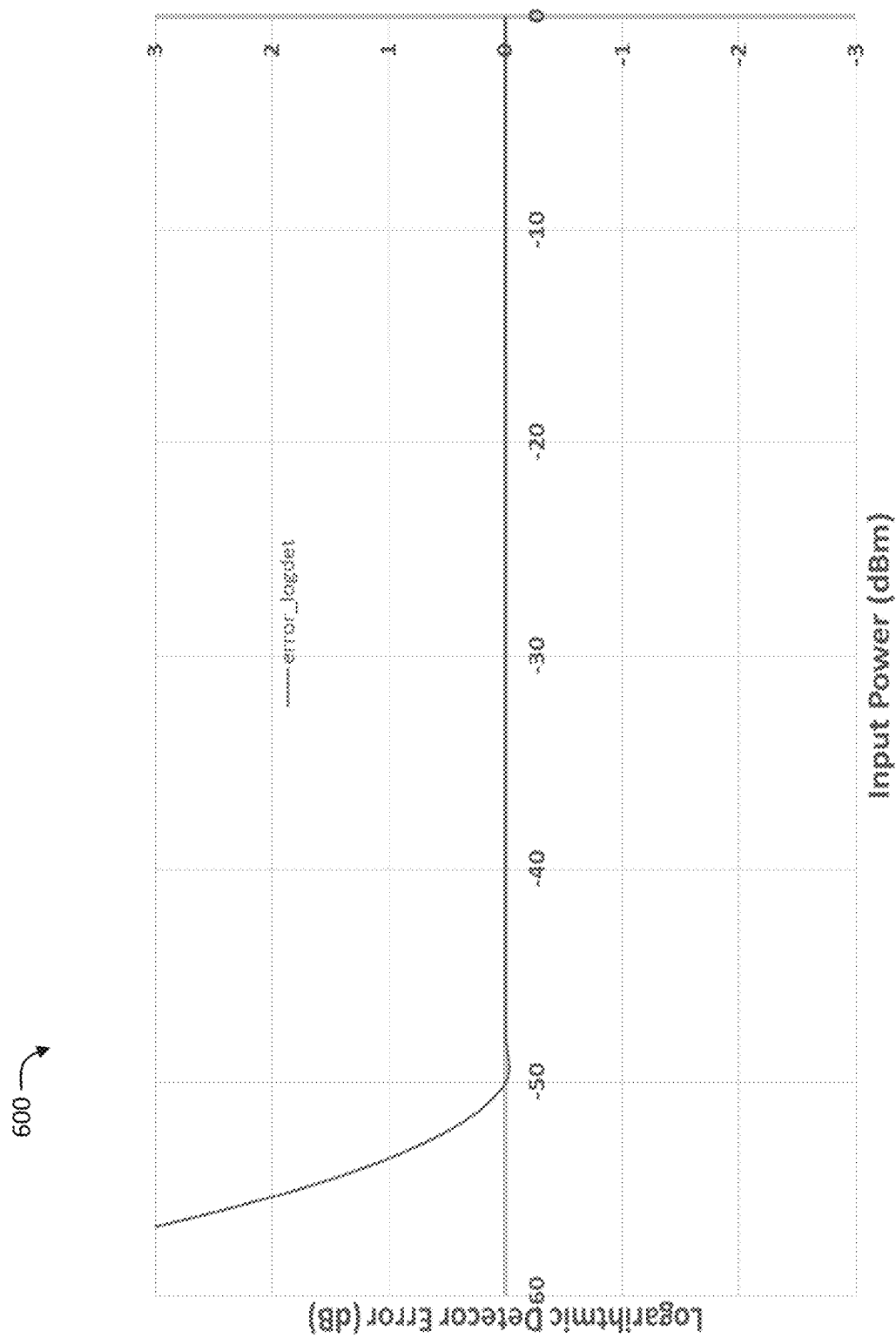
FIG. 6 illustrates a graph showing an error of a logarithmic output voltage of the log detector of FIG. 2 as a function of input power for an idealized scenario without noise at the input of the log detector.

As described above, each detector D of the detector circuit 220 may be a rectifying power detector. A combination of the rectifier outputs 221 by the combiner 230 is intended to result in log-linear characteristics. However, actual log detectors have finite amplification and, hence, can only provide log-linear characteristics for a limited range of input signals. This results in an error with respect to an ideal logarithmic detection curve for low-power input signal levels. An illustration of such a scenario is provided in FIG. 5, showing a graph 500 of a logarithmic output voltage, $V_{OUT}$, of the log detector 200 as a function of an input power (i.e., as a function of the power of the input voltage $V_{IN}$). In the graph 500, a curve 510 (shown as a dashed curve) illustrate an ideal logarithmic output voltage $V_{OUT}$, while a curve 520 (shown as a solid curve) illustrates an example actual logarithmic output voltage $V_{OUT}$ that may be output by the log detector 200 in practice when noise (e.g., thermal noise) at the input of a log detector may be eliminated or discarded (hence, the curve 520 is labeled in FIG. 5 as "logdet_nonoise"). As can be seen in the graph 500, there is an error in the logarithmic output voltage values for low input powers. Such an error can also be seen in FIG. 6, illustrates a graph 600 showing an error of a logarithmic output voltage of the log detector of FIG. 2 as a function of input power, also for the scenarios where noise at the input of a log detector (e.g., thermal noise) may be eliminated or discarded. As is shown in FIGS. 5 and 6, this error decreases as input power increases.

The illustrations of FIGS. 5 and 6 were for an idealized scenario without noise at the input of the log detector. FIGS.

Figure 7:
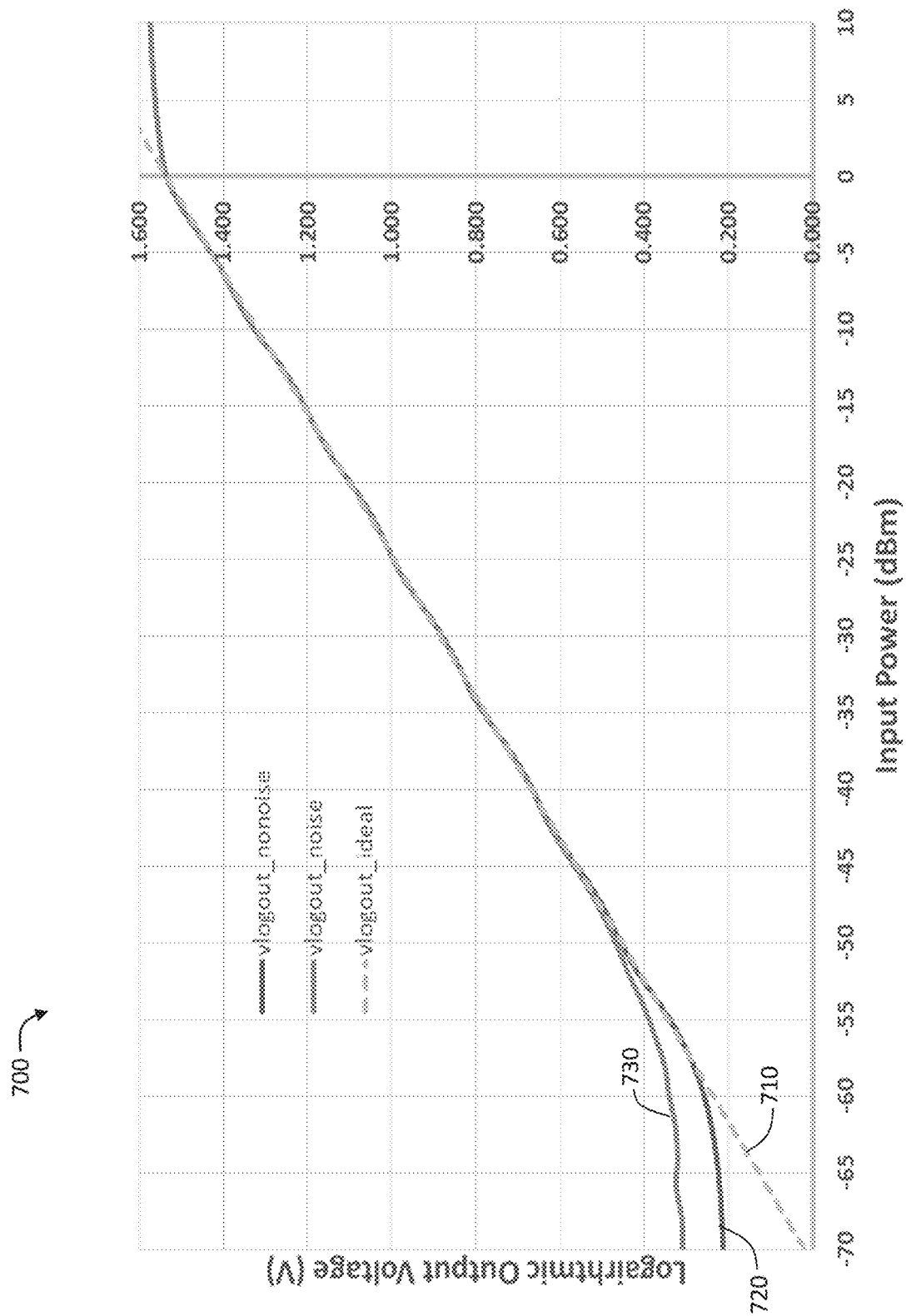
FIG. 7 illustrates a graph showing a logarithmic output voltage of the log detector of FIG. 2 as a function of input power for an example scenario with noise at the input of the log detector.
Figure 8:
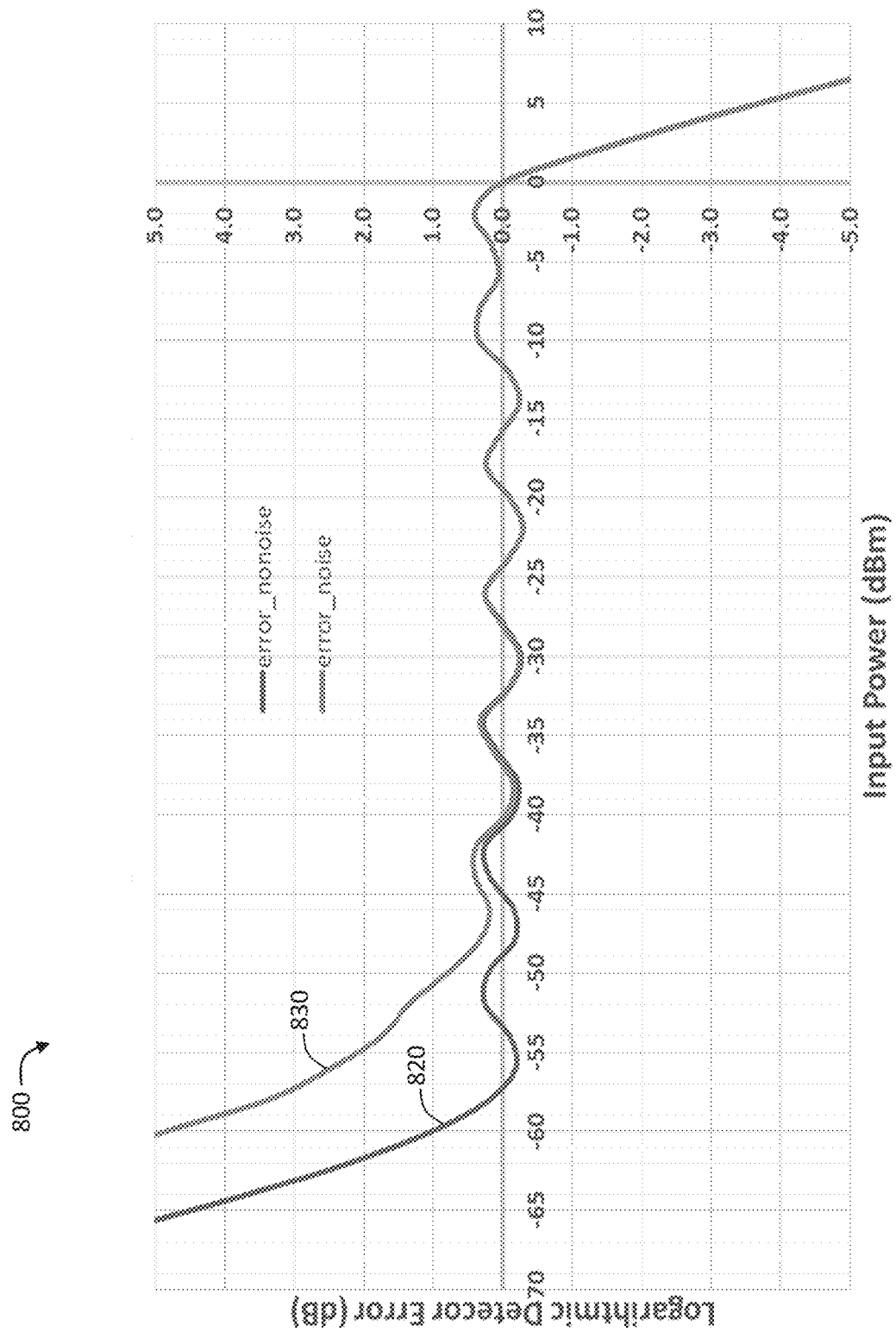
FIG. 8 illustrates a graph showing an error of a logarithmic output voltage of the log detector of FIG. 2 as a function of input power for an example scenario with noise at the input of the log detector.

7 and 13 provide analogous illustrations but for an example scenario with noise at the input of the log detector. FIG. 7 shows a graph 700 of a logarithmic output voltage, $V_{OUT}$, of the log detector 200 as a function of an input power (i.e., as a function of the power of the input voltage $V_{IN}$). In the graph 700, a curve 710 (shown as a dashed curve) illustrate an ideal logarithmic output voltage $V_{OUT}$ (similar to the curve 510), a curve 720 (shown as a solid curve) illustrates an example actual logarithmic output voltage $V_{OUT}$ that may be output by the log detector 200 in practice when noise at the input of a log detector may be eliminated or discarded (similar to the curve 520), and a curve 730 (also shown as a solid curve) illustrates an example actual logarithmic output voltage $V_{OUT}$ that may be output by the log detector 200 in practice when noise at the input of a log detector is not neglected (hence, the curve 730 is labeled in FIG. 7 as "logdet_noise"). Such a noise can be in the form of, e.g., thermal noise at the input of the log detector, e.g., generated by source or the detector itself. As can be seen in the graph 700, even very small amount of thermal noise at the input of a log detector may cause a non-negligible finite output signal, further increasing the error in the logarithmic output voltage values for low input powers. Such an error can also be seen in FIG. 8, illustrates a graph 800 showing an error of a logarithmic output voltage of the log detector of FIG. 2 as a function of input power. A curve 820 shown in FIG. 8 corresponds to the error for the curve 720 (i.e., no-noise scenario) and a curve 830 corresponds to the error for the curve 730 (i.e., noise at the input of a log detector).

Log Detectors with Noise Compensation

As is shown in FIGS. 7 and 8, although the error attributed to the noise at the input of a log detector decreases as input power increases, it may still be comparable and equivalent to an actual input signal to the log detector and may noticeably increase the output baseline (i.e., the output voltage for no input signal) of the log detector. Such input noise level is then amplified by the amplifiers $A_1$-$A_N$ and appears as a signal at the input of the detectors $D_1$-$D_N$ at the end of the chain, thus wasting the usable range of these detectors.

Embodiments of the present disclosure are based on recognition that, since any input signal will be superimposed on this equivalent input referred noise, highest gain detectors (i.e., at least the detector DN and possibly additional detectors preceding the detector DN of the detector circuit 220) will respond differently than others and the log-linear characteristics will be distorted, resulting in further dynamic range loss. Simulations have supported that, showing a 9 dB dynamic range drop due to noise at the low-end of input powers for a high-frequency log detector with a 1 dB error limit. Embodiments of the present disclosure are further based on recognition that changing certain operating parameters (e.g., a DC offset signal) of the one or more highest gain detectors of a log detector may help alleviate the problem caused by the input noise at the low-end of input signals. One way of changing operating parameters of one of more of the highest gain detectors of a log detector is described herein with reference to detectors implemented using TTCs, however, in general, other ways of changing operating parameters of one of more of the highest gain detectors of a log detector to reduce or eliminate errors caused by the input noise at the low-end of input signals are possible and within the scope of the present disclosure.

Figure 9:
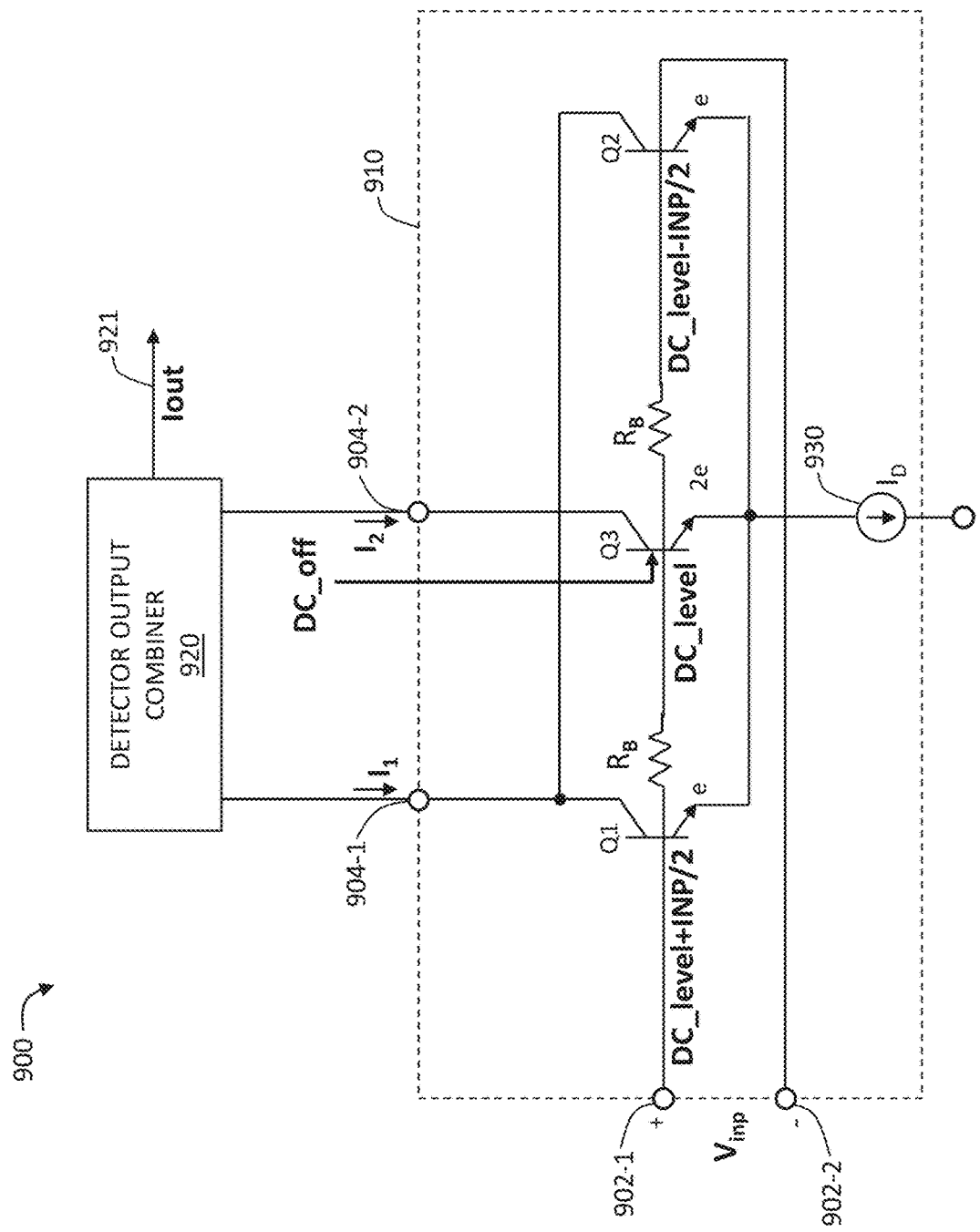
FIG. 9 provides an electric circuit diagram illustrating an arrangement of an amplifier and a triple-tail cell (TTC) circuit, according to some embodiments of the present disclosure.

FIG. 9 provides an electric circuit diagram illustrating an arrangement 900 of a TTC 910 and a detector output combiner 920, according to some embodiments of the present disclosure. The arrangement 900 may be configured to perform full-wave rectification (e.g., the arrangement 900 may serve as a gain cell and a full-wave rectifier) and have suitable nonlinear characteristics to be used in some or all of the detectors of a detector circuit of a log detector. For example, in some embodiments, the arrangement 900 may be any of the detectors D of the log detector 1000. Although not specifically shown in FIG. 9, other detectors of the log detector 1000 may be implemented as the arrangement 900, using a TTC similar to the TTC 910.

As shown in FIG. 9, the TTC 910 includes a plurality of transistors, including a first transistor Q1, a second transistor Q2, and a third transistor Q3. In some embodiments, the plurality of transistors may be bipolar transistors, e.g., N-type bipolar (NPN) transistors, as is shown in the illustration of FIG. 9. However, in other embodiments, the TTC 910 may be implemented using P-type bipolar (PNP) transistors, or field-effect transistors (FETs) of either N-type (e.g., N-type metal-oxide-semiconductor (NMOS) transistors) or P-type (e.g., P-type metal-oxide-semiconductor (PMOS) transistors). Therefore, to be general to both bipolar and FET implementations, individual terminals of the transistors of the TTC 910 are referred to herein as first, second, and third terminals, where the term "first terminal" of a transistor is used to refer to a base terminal if the transistor is a bipolar transistor or to a gate terminal if the transistor is a FET, the term "second terminal" of a transistor is used to refer to a collector terminal if the transistor is a bipolar transistor or to a drain terminal if the transistor is a FET, and the term "third terminal" of a transistor is used to refer to an emitter terminal if the transistor is a bipolar transistor or to a source terminal if the transistor is a FET. These terms remain the same irrespective of whether a transistor of a given technology is an N-type transistor (e.g., an NPN transistor if the transistor is a bipolar transistor or an NMOS transistor if the transistor is a FET) or a P-type transistor (e.g., a PNP transistor if the transistor is a bipolar transistor or a PMOS transistor if the transistor is a FET).

As shown in FIG. 9, the arrangement 900 (in particular, the TTC 910) may receive an input signal as a differential voltage applied between input nodes 902-1 and 902-2. For example, a differential input voltage Vinp=INP may be applied between the first terminals of the transistors Q1 and Q2, with a DC voltage component denoted in FIG. 9 as "DC_level." The differential voltage Vinp applied between the input nodes 902-1 and 902-2 may, e.g., be the output signal 211 of any of the amplifiers $A_1$-$A_N$ of the log detector 1000 or the input voltage $V_{IN}$ in case the arrangement 900 implements the detector Do of the log detector 1000. As shown in FIG. 9, the first terminal of the transistor Q1 may be coupled to the input node 902-1 (and, thus, configured to receive a voltage DC_level+INP/2), while the first terminal of the transistor Q2 may be coupled to the input node 902-2 (and, thus, configured to receive a voltage DC_level-INP/2). The transistors Q1 and Q2 form a differential pair with emitter areas substantially equal to each other, while the transistor Q3 may have an emitter area larger than that of the transistors Q1 and Q2, e.g., about 2 times larger. The first terminal of the transistor Q3 may receive only the DC component DC_level, as well as, at least for some of the detectors of the log detector 1000, an additional DC offset component DC_off, resulting in a bias voltage value of DC_level+DC_off. Thus, in the arrangement 900, the differential inputs at the input nodes 902-1 and 902-2 would induce voltage levels of DC_level+INP/2 and DC_level-INP/2 at the input of the detector (where INP is the RF signal, and DC_level is a DC bias signal). The middle point (i.e., the first terminal of the middle transistor Q3) would receive the same DC bias level of DC_level and, possibly, an offset voltage of DC_off. In some embodiments of the TTC 910, resistors Rb may be included, to generate the midpoint voltage level at the first terminal of the transistor Q3. As shown in FIG. 9, one of the resistors Rb may be coupled between the first terminals of the transistors Q1 and Q3, and another one of the resistors Rb may be coupled between the first terminals of the transistors Q3 and Q2. As further shown in FIG. 9, a current source 930 may be coupled to a common-emitter (i.e., the third terminals of the transistors Q1, Q2, and Q3 are coupled together) generating a tail-current $I_D$.

The output of the TTC 910 may be a differential current between output nodes 904-1 and 904-2, shown in FIG. 9 as an output current $I_1$ in a first branch of the differential output (i.e., at the first output node 904-1) and an output current $I_2$ in a second branch of the differential output (i.e., at the second output node 904-2). As shown in FIG. 9, the second terminal of the transistor Q1 and the second terminal of the transistor Q2 may both be coupled to the output node 904-1, while the second terminal of the transistor Q3 may be coupled to the output node 904-2. The output nodes 904-1 and 904-2 may further be coupled to the detector output combiner 920. The detector output combiner 920 may be configured to combine the signals $I_1$ and $I_2$ at the output nodes 904-1 and 904-2 to produce a detector output signal 921. In some embodiments, the detector output signal 921 may be a signal indicative of the difference between the currents $I_1$ and $I_2$. In some such embodiments, the detector output signal 921 may be a current signal Iout, where Iout=$I_1$–$I_2$. In other such embodiments, the detector output signal 921 may be a voltage signal indicative of the difference between the currents $I_1$ and $I_2$. For example, the detector output combiner 920 may be configured to convert the currents $I_1$ and $I_2$ to voltages and then producing the detector output signal 921 as the difference between these respective voltages. The output 921 may be an output of the respective detector D of a log detector that is implemented by the TTC 910 (e.g., the output 921 may be one of the outputs 1021 of the log detector 1000, shown in FIG. 10 and described below). Since the detector output signals 921 of the different detectors D of such a log detector may later be combined with the combiner 230 (e.g., as is described below for the log detector 1000 of FIG. 10), in some implementations it may be, therefore, be preferable that the detector output signals 921 are current signals.

Figure 10:
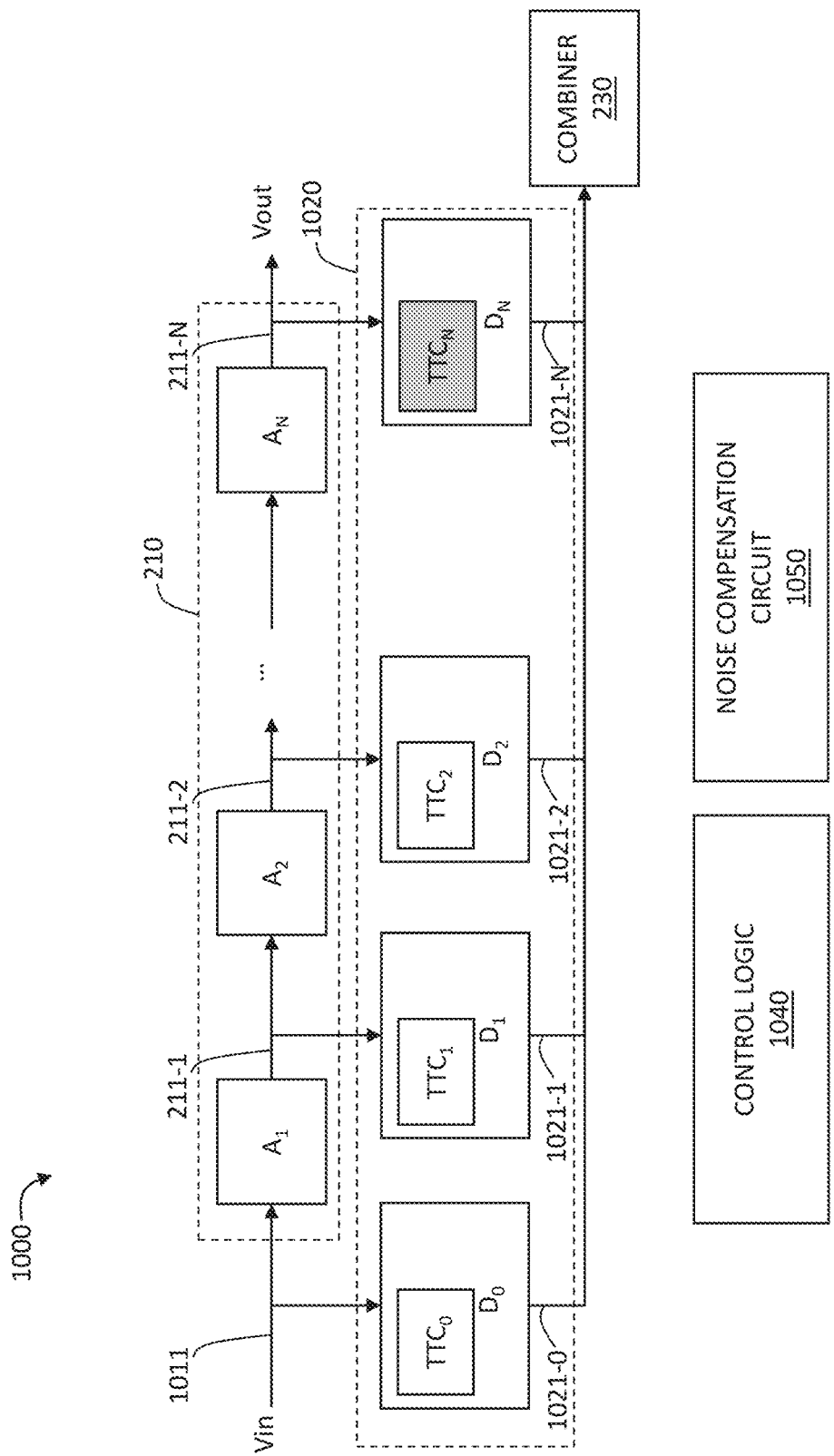
FIG. 10 provides a schematic block diagram illustrating a log detector with noise compensation by having at least one highest gain detector implemented using a TTC configured to operate with operating parameters different of those of at least some other detectors, according to some embodiments of the present disclosure.

FIG. 10 provides a schematic block diagram illustrating a log detector 1000 with at least one highest gain detector implemented using a TTC configured to operate with operating parameters different of those of at least some other detectors, according to some embodiments of the present disclosure. As shown in FIG. 10, the log detector 1000 may include the gain or attenuation circuit 210 and the combiner 230 as described with reference to FIG. 2, and further include a detector circuit 1020.

The detector circuit 1020 may be similar to the detector circuit 220, described with reference to FIG. 2, except for the following differences.

First of all, the detector 1020 may also include a detector Do, as shown in FIG. 10. The detector Do may receive the input voltage $V_{IN}$ as an input, and an output 1021-0 of the detector Do may be combined with the outputs 1021-1 through 1021-N by the combiner 230, as was described above the output 221-1 through 221-N of the detectors of the detector circuit 220.

Second, some or all of the detectors D of the detector circuit 1020 may include at least one TTC, e.g., the TTC 910 as shown in FIG. 9 (e.g., may be implemented as the arrangement 900 of FIG. 9). At least one highest gain detector, i.e., at least the detector $D_N$, may receive an additional DC offset voltage DC_off that is different from those of at least one other detector of the detector circuit 1020 (e.g., different from that of the detector $D_0$ or $D_1$). In some embodiments, K of the highest gain detectors (i.e., detectors $D_{N-K}$ through $D_N$, where K is a positive integer smaller than N) may receive same or different additional DC offset voltages DC_off, different from those of at least one other detector of the detector circuit 1020. This is drastically different from conventional log detectors implemented using TTCs in the individual detectors, where even though those TTCs may receive additional DC offset voltage DC_off at the first terminals of their transistors Q3, different detectors receive the same additional DC offset voltage DC_off. Furthermore, some conventional log detectors may be implemented such that each individual detector includes two TTCs and that the two TTCs of a single detector may receive different additional DC offset voltages at the first terminal of their respective transistors Q3, e.g., an additional DC offset voltage DC_off1 received at the first terminal of the transistor Q3 of the first TTC of a given detector, and an additional DC offset voltage DC_off2, different from DC_off1, received at the first terminal of the transistor Q3 of the second TTC of that detector. However, in such implementations, different detectors still receive the same DC offset voltages at their respective first and second TTCs, i.e., for each of the detectors, an additional DC offset voltage DC_off1 is received at the first terminal of the transistor Q3 of the first TTC of a detector, and an additional DC offset voltage DC_off2, different from DC_off1, is received at the first terminal of the transistor Q3 of the second TTC of the detector. In contrast, in the log detector 1000, at least the first terminal of the TTC of the detector $D_N$ is configured to receive a DC offset voltage DC_off that has a value not received by a TTC of at least one other detector D (e.g., a value not received by any other TTCs of the log detector 1000).

Figure 11:
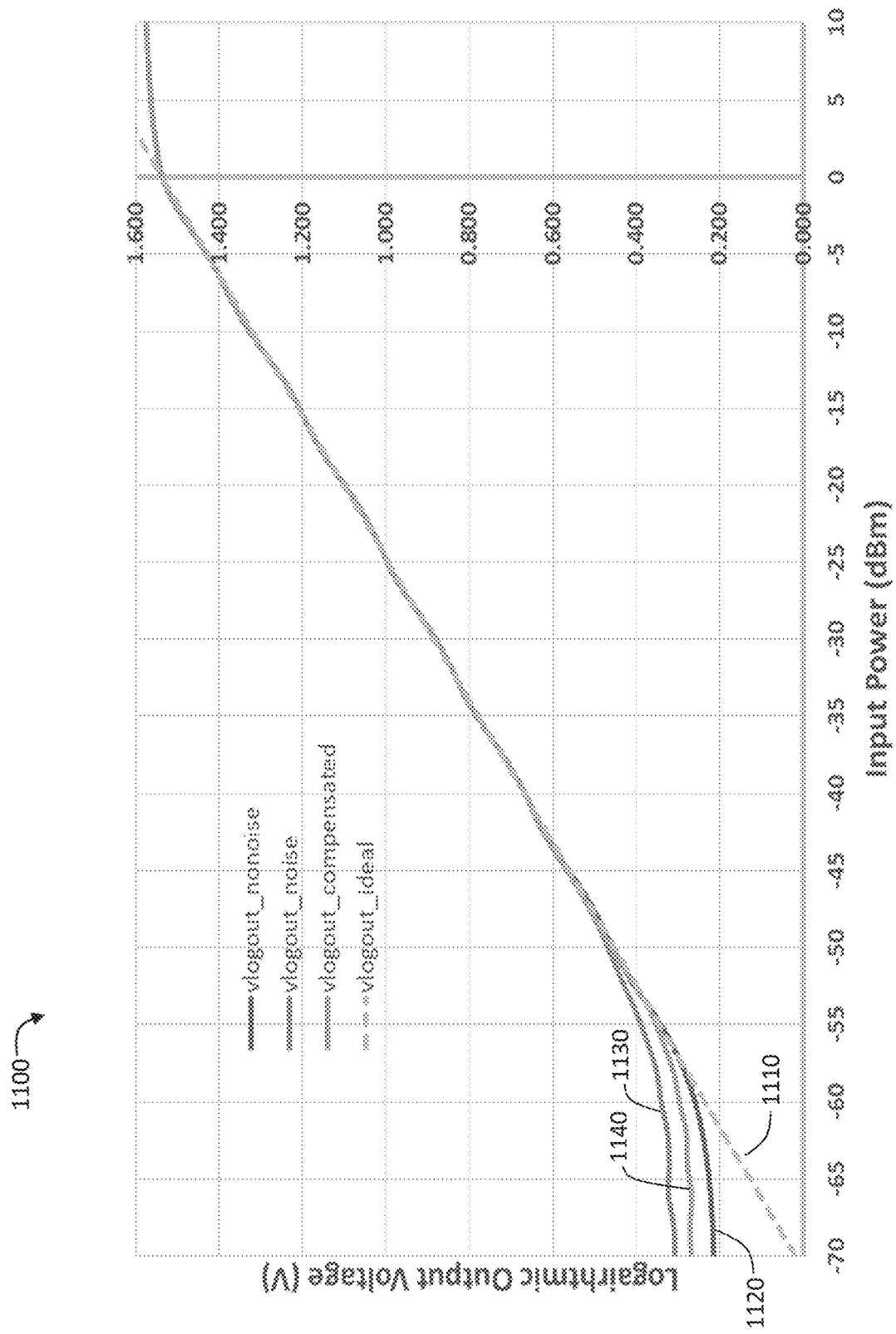
FIG. 11 illustrates a graph showing a logarithmic output voltage of the log detector with noise compensation of FIG. 10 as a function of input power for an example scenario with noise at the input of the log detector.
Figure 12:
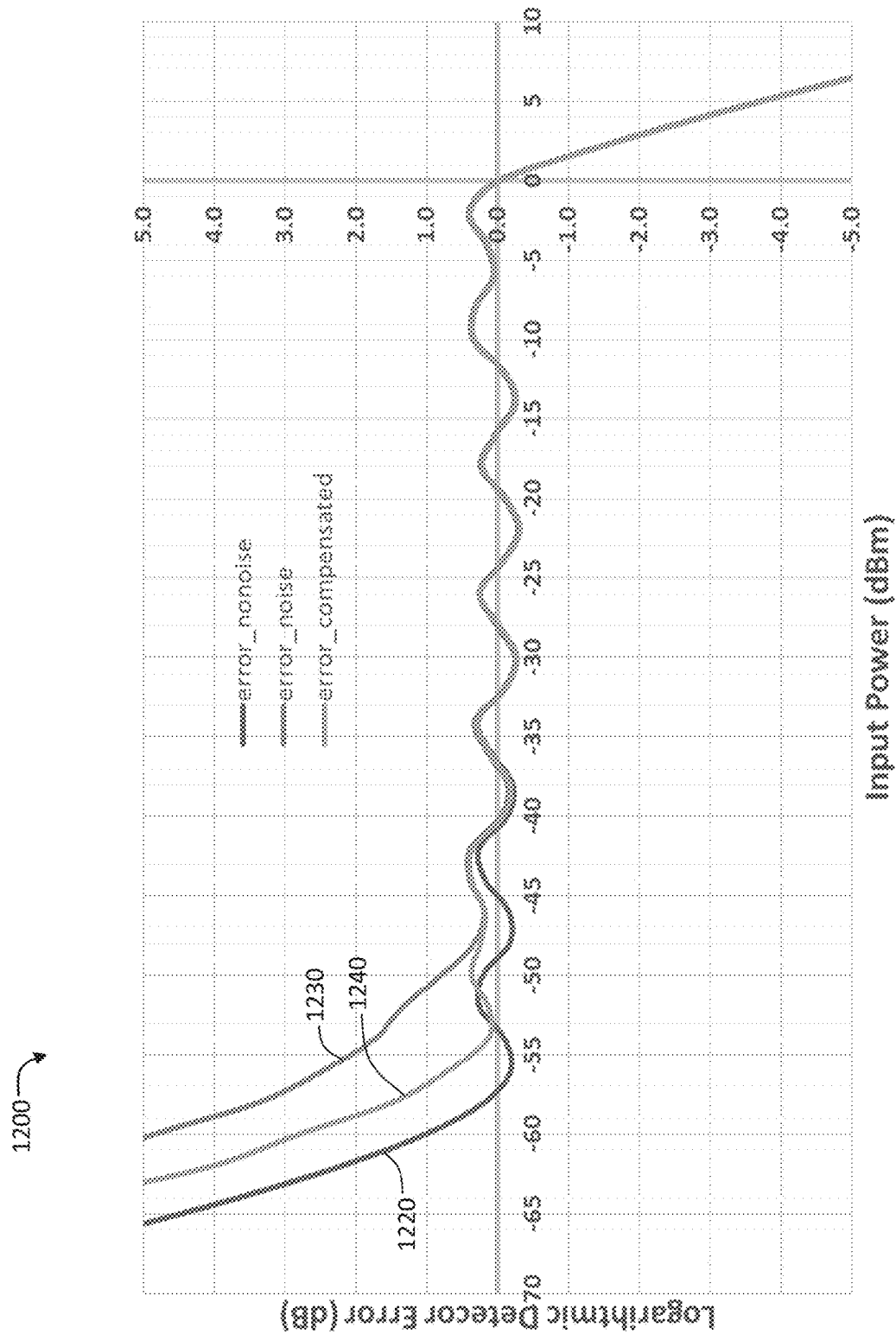
FIG. 12 illustrates a graph showing an error of a logarithmic output voltage of the log detector with noise compensation of FIG. 10 as a function of input power for an example scenario with noise at the input of the log detector.

In some embodiments, the additional DC offset voltage may be applied to the first terminal of the transistor Q3 of the detectors $D_{N-K}$ through $D_N$ by having a respective adjustable current Ishift coupled thereto, thus generating a DC shift in the middle node voltages of these detectors. This shift in the DC voltage with respect to the DC voltage DC_level of positive and negative inputs of the detectors may transform the output/input characteristics of these detectors and may be used to improve the log-linear characteristics of the log detector 1000. In other words, the log detector 1000 may provide effective noise compensation to reduce or eliminate errors caused by the input noise, especially for low-power and/or high-frequency input signals. This is shown in FIGS. 11 and 12, providing analogous illustrations to those of FIGS. 7 and 8, respectively, but for the log detector 1000 of FIG. 10. FIG. 11 shows a graph 1100 of a logarithmic output voltage, $V_{OUT}$, of the log detector 1000 as a function of an input power (i.e., as a function of the power of the input voltage $V_{IN}$). In the graph 1100, a curve 1110 (shown as a dashed curve) illustrate an ideal logarithmic output voltage $V_{OUT}$ (similar to the curves 510, 710) of an ideal log detector, a curve 1120 (shown as a solid curve) illustrates an example actual logarithmic output voltage $V_{OUT}$ that may be output by a log detector in practice when noise at the input of a log detector may be eliminated or discarded (similar to the curves 520, 720), and a curve 1130 (also shown as a solid curve) illustrates an example actual logarithmic output voltage $V_{OUT}$ that may be output by a log detector in practice when noise at the input of a log detector is not neglected (similar to the curve 730), and a curve 1140 (also shown as a solid curve) illustrates an example actual logarithmic output voltage $V_{OUT}$ that may be output by the log detector 1000 that includes noise compensation as described herein (hence, the curve 1140 is labeled in FIG. 11 as "logdet_compensated"). As can be seen in the graph 1100, the noise compensation implemented by the log detector 1000 may reduce the additional output signal at low input powers, reducing the error in the logarithmic output voltage values for low input powers. Such an error can also be seen in FIG. 12, illustrates a graph 1200 showing an error of a logarithmic output voltage of the log detector 1000 of FIG. 10 as a function of input power. A curve 1220 shown in FIG. 12 corresponds to the error for the curve 1120 (i.e., no-noise scenario), a curve 1230 corresponds to the error for the curve 1130 (i.e., noise at the input of a log detector), and a curve 1240 corresponds to the error for the curve 1140 (i.e., compensated noise at the input of the log detector 1000).

The amount of noise present in a given system may depend on a variety of factors, such as temperature, process variations, voltage, etc. Therefore, the exact value of the DC offset voltage to be applied to the one or more of the last detectors of a detector chain as described herein may depend on such factors. In view of that, in some embodiments, the log detector 1000 may include, or be communicatively coupled to, a control logic 1040 and a noise compensation circuit 1050.

Figure 15:
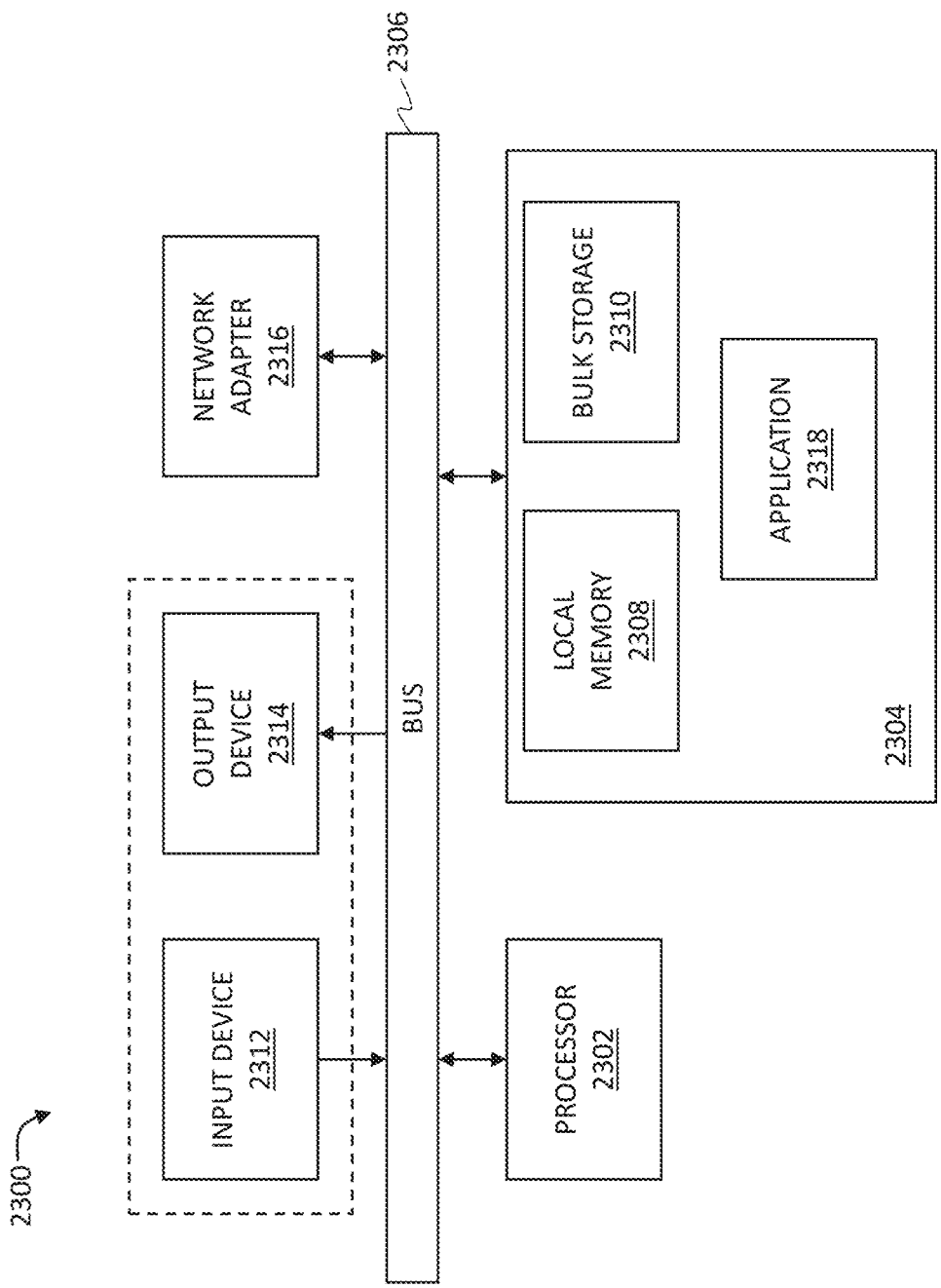
FIG. 15 provides a block diagram illustrating an example data processing system that may be configured to implement, or control, at least portions of a log detector with noise compensation, according to some embodiments of the present disclosure.

The control logic 1040 may be configured to control at least some of operations of noise compensation described herein, e.g., to control the amount and the timing of when any of the DC offset voltages as described herein are to be applied to various detectors of the log detector 1000. An example data processing system that may be used to implement the control logic 1040 is shown in FIG. 15.

The noise compensation circuit 1050 may be configured to determine a DC offset voltage to be applied to the one or more of the last detectors of the log detector 1000. For example, the amount of noise to be compensated may depend on the temperature and, therefore, the noise compensation to be applied in the log detector 1000 as described herein may be a form of temperature compensation. As used herein, "temperature compensation" may refers to the amount indicative of a DC offset voltage DC_offset (which may be either positive or negative) to the one or more of the last detectors of the log detector 1000 in addition to the DC voltage level DC_level, to realize the desired DC voltage at the base/gate terminal of the TTC cells of such detectors, where the additional DC offset voltage is intended to reduce or minimize how a DC voltage realized in a real-life device may differ depending on the temperature of the device.

In some embodiments, the noise compensation circuit 1050 may be configured to determine the DC offset voltage based on a temperature signal indicative of a temperature of one or more components of the gain or attenuation circuit 210 and/or of one or more components of the detector circuit 1020 of the log detector 1000. For example, in some embodiments, the log detector 1000 may include a temperature sensor (not specifically shown in the present figures), configured to generate a signal indicative of the temperature, which signal may, e.g., be provided to the noise compensation circuit 1050. In other embodiments, the temperature sensor may be remote (i.e., not included in the log detector 1000).

In some embodiments, in order for the noise compensation circuit 1050 to determine the DC offset voltage compensation to be applied, the noise compensation circuit 1050 may be provided with information indicative of how a DC voltage at the base/gate terminal of the TTC cells of one or more of the last detectors of the log detector 1000 may vary as a function of temperature. In some such embodiments, this information may be pre-determined and provided to the noise compensation circuit 1050, e.g., may be pre-programmed and/or stored in the memory of the noise compensation circuit 1050. However, in other embodiments, it may be desirable to generate such information once the log detector 1000 has been deployed in the field, e.g., every time the log detector 1000 is being turned on, periodically after certain time periods (e.g., every 15 seconds or minutes), or at some specific times (e.g., as triggered by the control logic 1040, e.g., as triggered by a human operator of the log detector 1000). In some such embodiments, the noise compensation circuit 1050 may be configured to carry out a method as shown in FIG. 13.

Figure 13:
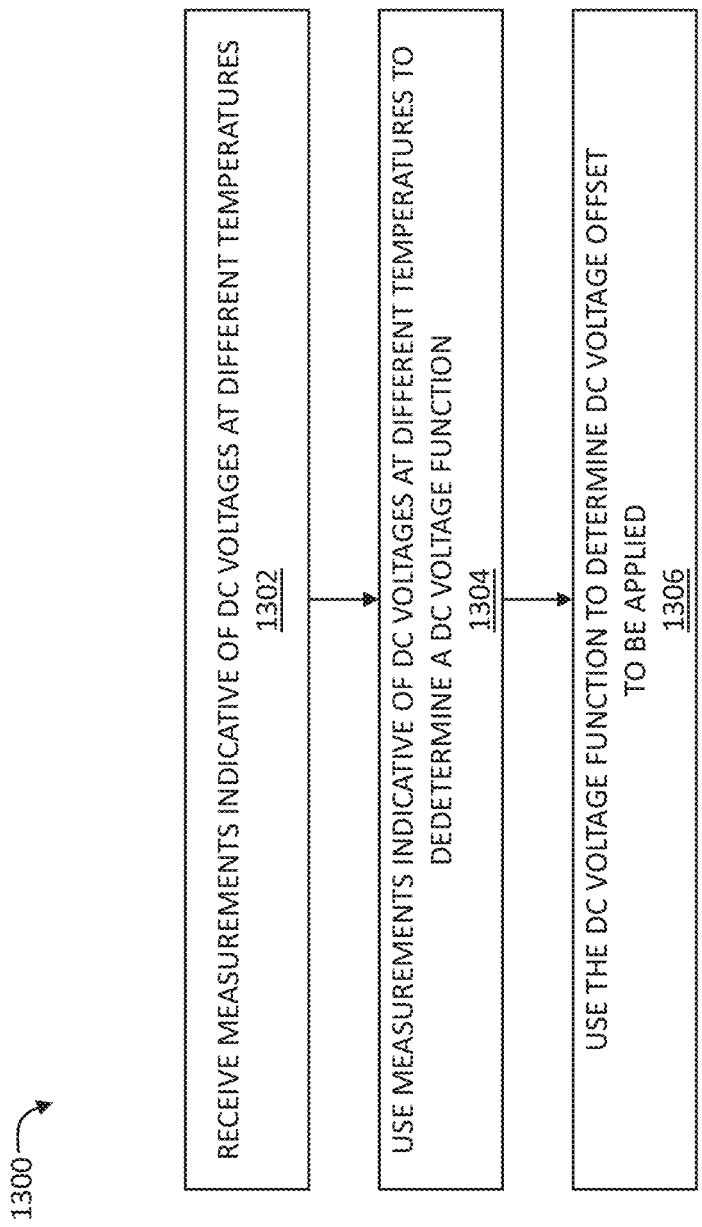
FIG. 13 provides a block diagram illustrating a method for realizing a temperature-dependent noise compensation, according to some embodiments of the present disclosure.

FIG. 13 provides a block diagram illustrating a method 1300 for realizing a temperature-dependent noise compensation in the log detector 1000, according to some embodiments of the present disclosure. Although operations of the method 1300 are described with reference to the system components shown in FIG. 10, in general, any system configured to perform these operations, in any order, is within the scope of the present disclosure. In some embodiments, the control logic 1040 and/or the noise compensation circuit 1050 may be configured to control the operations of the method 1300.

Although not specifically shown in FIG. 13, the method 1300 may begin with the noise compensation circuit 1050 selecting a temperature range over which calibration measurements to produce a function of how a DC voltage at the base/gate terminal of the TTC cell of, e.g., the last detector of the log detector 1000 depends on temperature are to be provided. As shown in FIG. 13, at 1302, the method 1300 may include the noise compensation circuit 1050 receiving said measurements performed at two or more different temperatures. In some embodiments, the measurements received at 1302 may be performed as follows. The RF power at the input of the log detector may be swept in steps (e.g., with a 1 dB increase in each step), and the output voltage curve may be recorded. The DC offset voltages may then be selected for a transfer curve providing the optimal dynamic range and may be determined iteratively and/or in mathematical from some number of calculations.

In some embodiments, the measurements received at 1302 may include measurements performed at only two different temperatures. In other embodiments, the measurements received at 1302 may include measurements performed at more than two different temperatures. In various embodiments, the measurements received at 1302 may include multiple measurements for a given temperature, e.g., so that the resulting values could be averaged. Receiving measurements for at least two different measurements would enable the noise compensation circuit 1050 to determine how said DC voltage may vary with temperature but receiving measurements at more than two different temperatures may improve accuracy/resolution of the temperature-dependent noise compensation.

At 1304, the noise compensation circuit 1050 may use the measurements received at 1304 to determine a DC voltage function, i.e., to determine a function indicative of DC voltage variations depending on the temperature. In various embodiments, the DC voltage function may be determined by, e.g., a linear interpolation, a polynomial, extrapolation, numerical curve-fitted function, and so on. For example, at

1304, the noise compensation circuit 1050 may define the required DC voltage slope across temperature.

Determining the function at 1304 allows the noise compensation circuit 1050 to determine the temperature-dependent noise compensation to be applied to achieve the target DC voltage, at 1306, as shown in FIG. 13. For example, in some embodiments, the noise compensation circuit 1050 may be configured to determine the DC voltage offset value based on a temperature signal as described above.

Example Devices and Systems

Figure 14:
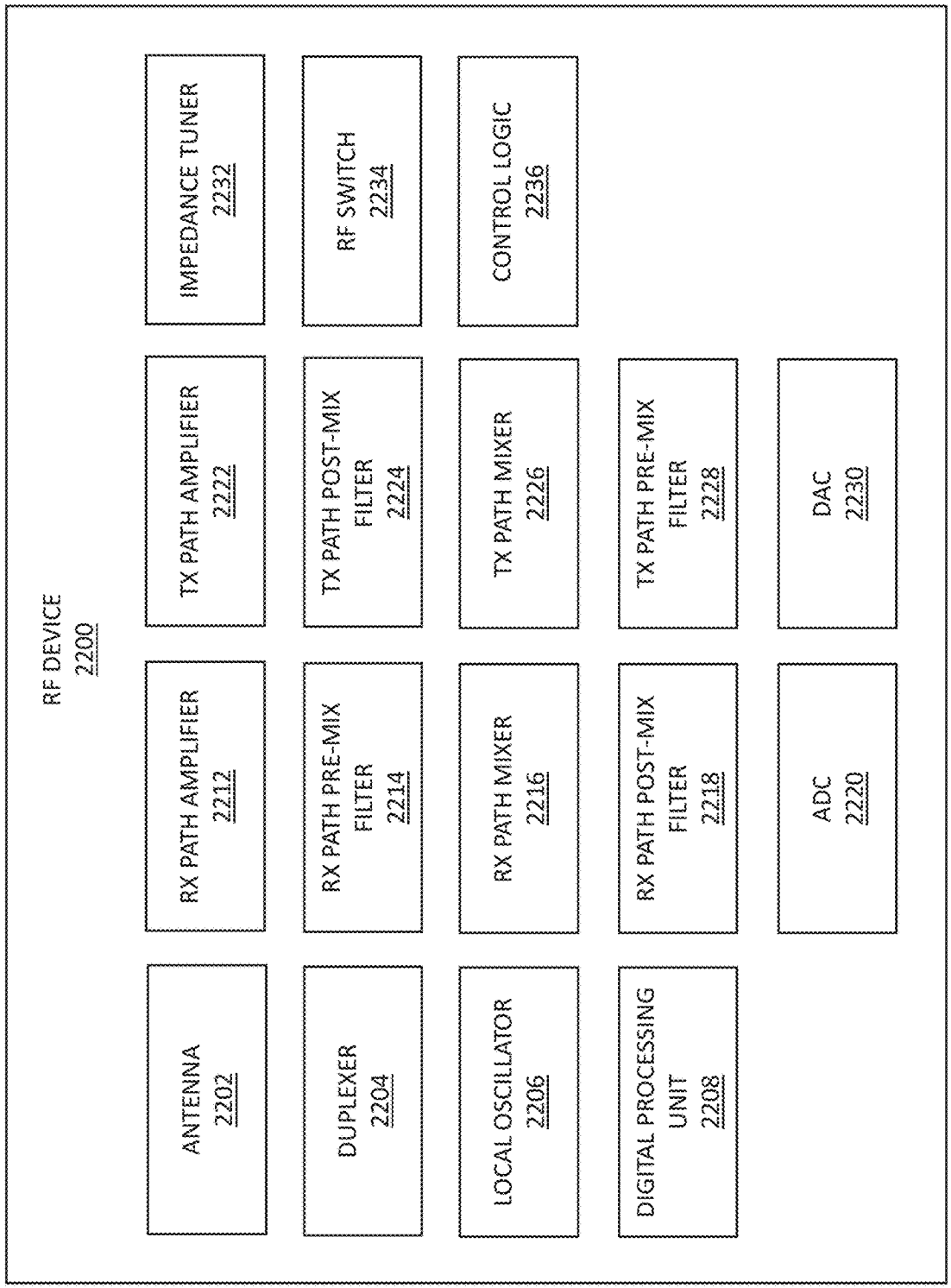
FIG. 14 provides a schematic block diagram illustrating an RF system in which a log detector with noise compensation may be implemented, according to some embodiments of the present disclosure.

In some embodiments, log detectors with noise compensation as described herein may be included in various RF devices and systems used in wireless communications. For illustration purposes only, one example RF device that may include any of the log detectors with noise compensation described herein is shown in FIG. 14 and described below. However, in general, log detectors with noise compensation as described herein may be included in systems other than radio communications, such as in acoustic systems, sonar imaging, or any other systems where power of a signal may need to be measured and where noise should be compensated during such power measurements, all of which being within the scope of the present disclosure.

FIG. 14 is a block diagram of an example RF device 2200, e.g., an RF transceiver, in which any of the log detectors with noise compensation as described herein may be implemented, according to some embodiments of the present disclosure.

In general, the RF device 2200 may be any device or system that may support wireless transmission and/or reception of signals in the form of electromagnetic waves in the RF range of approximately 3 kilohertz (kHz) to approximately 300 gigahertz (GHz). In some embodiments, the RF device 2200 may be used for wireless communications, e.g., in a base station (BS) or a user equipment (UE) device of any suitable cellular wireless communications technology, such as GSM, WCDMA, or LTE. In a further example, the RF device 2200 may be used as, or in, e.g., a BS or a UE device of a millimeter-wave wireless technology such as fifth generation (5G) wireless (i.e., high-frequency/short-wavelength spectrum, e.g., with frequencies in the range between about 20 and 60 GHz, corresponding to wavelengths in the range between about 5 and 15 millimeters). In yet another example, the RF device 2200 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF device 2200 may be used for wireless communications using Bluetooth technology (e.g., a frequency band from about 2.4 to about 2.485 GHz, corresponding to a wavelength of about 12 cm). In other embodiments, the RF device 2200 may be used for transmitting and/or receiving RF signals for purposes other than communication, e.g., in an automotive radar system, or in medical applications such as MRI.

In various embodiments, the RF device 2200 may be included in frequency-domain duplex (FDD) or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

Several components are illustrated in FIG. 14 as included in the RF device 2200, but any one or more of these components may be omitted or duplicated, as suitable for the application. For example, in some embodiments, the RF device 2200 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2200 may be an RF device supporting only wireless reception (e.g., an RF receiver), in which case it may include the components of the RX path, but not the components of the TX path; or the RF device 2200 may be an RF device supporting only wireless transmission (e.g., an RF transmitter), in which case it may include the components of the TX path, but not the components of the RX path.

In some embodiments, some or all the components included in the RF device 2200 may be attached to one or more motherboards. In some embodiments, some or all these components are fabricated on a single die, e.g., on a single system on chip (SOC) die.

Additionally, in various embodiments, the RF device 2200 may not include one or more of the components illustrated in FIG. 14, but the RF device 2200 may include interface circuitry for coupling to the one or more components. For example, the RF device 2200 may not include an antenna 2202, but may include antenna interface circuitry (e.g., a matching circuitry, a connector and driver circuitry) to which an antenna 2202 may be coupled. In another set of examples, the RF device 2200 may not include a digital processing unit 2208 or a local oscillator 2206, but may include device interface circuitry (e.g., connectors and supporting circuitry) to which a digital processing unit 2208 or a local oscillator 2206 may be coupled.

As shown in FIG. 14, the RF device 2200 may include an antenna 2202, a duplexer 2204 (e.g., if the RF device 2200 is an FDD RF device; otherwise the duplexer 2204 may be omitted), a local oscillator 2206, a digital processing unit 2208. As also shown in FIG. 14, the RF device 2200 may include an RX path that may include an RX path amplifier 2212, an RX path pre-mix filter 2214, a RX path mixer 2216, an RX path post-mix filter 2218, and an analog-to-digital converter (ADC) 2220. As further shown in FIG. 14, the RF device 2200 may include a TX path that may include a TX path amplifier 2222, a TX path post-mix filter 2224, a TX path mixer 2226, a TX path pre-mix filter 2228, and a digital-to-analog converter (DAC) 2230. Still further, the RF device 2200 may further include an impedance tuner 2232, an RF switch 2234, and control logic 2236. In various embodiments, the RF device 2200 may include multiple instances of any of the components shown in FIG. 14. In some embodiments, the RX path amplifier 2212, the TX path amplifier 2222, the duplexer 2204, and the RF switch 2234 may be considered to form, or be a part of, an RF front-end (FE) of the RF device 2200. In some embodiments, the RX path amplifier 2212, the TX path amplifier 2222, the duplexer 2204, and the RF switch 2234 may be considered to form, or be a part of, an RF FE of the RF device 2200. In some embodiments, the RX path mixer 2216 and the TX path mixer 2226 (possibly with their associated pre-mix and post-mix filters shown in FIG. 14) may be considered to form, or be a part of, an RF transceiver of the RF device 2200 (or of an RF receiver or an RF transmitter if only RX path or TX path components, respectively, are included in the RF device 2200). In some embodiments, the RF device 2200 may further include one or more control logic elements/circuits, shown in FIG. 14 as control logic 2236, e.g., an RF FE control interface. In some embodiments, the control logic 2236 may be configured to control at least portions of performing noise compensation in a log detector as described herein, e.g., when the log detector 1000 is used to measure power of the electrical signals in the TX path (e.g., to measure the power of signals provided to the antenna 2202 to be transmitted). To that end, the control logic 2236 may include the control logic 1040 and/or the noise compensation circuit 1050, as described above. In some embodiments, the control logic 2236 may be used to perform control other functions within the RF device 2200, e.g., enhance control of complex RF system environment, support implementation of envelope tracking techniques, reduce dissipated power, etc.

The antenna 2202 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2200 is an FDD transceiver, the antenna 2202 may be configured for concurrent reception and transmission of communication signals in separate, i.e., non-overlapping and non-continuous, bands of frequencies, e.g., in bands having a separation of, e.g., 20 MHz from one another. If the RF device 2200 is a TDD transceiver, the antenna 2202 may be configured for sequential reception and transmission of communication signals in bands of frequencies that may be the same or overlapping for TX and RX paths. In some embodiments, the RF device 2200 may be a multi-band RF device, in which case the antenna 2202 may be configured for concurrent reception of signals having multiple RF components in separate frequency bands and/or configured for concurrent transmission of signals having multiple RF components in separate frequency bands. In such embodiments, the antenna 2202 may be a single wide-band antenna or a plurality of band-specific antennas (i.e., a plurality of antennas each configured to receive and/or transmit signals in a specific band of frequencies). In various embodiments, the antenna 2202 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2200 may include more than one antenna 2202 to implement antenna diversity. In some such embodiments, the RF switch 2234 may be deployed to switch between different antennas.

An output of the antenna 2202 may be coupled to the input of the duplexer 2204. The duplexer 2204 may be any suitable component configured for filtering multiple signals to allow for bidirectional communication over a single path between the duplexer 2204 and the antenna 2202. The duplexer 2204 may be configured for providing RX signals to the RX path of the RF device 2200 and for receiving TX signals from the TX path of the RF device 2200.

The RF device 2200 may include one or more local oscillators 2206, configured to provide local oscillator signals that may be used for downconversion of the RF signals received by the antenna 2202 and/or upconversion of the signals to be transmitted by the antenna 2202.

The RF device 2200 may include the digital processing unit 2208, which may include one or more processing devices. The digital processing unit 2208 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 14, in some embodiments, the RF device 2200 may further include a memory device, configured to cooperate with the digital processing unit 2208.

Turning to the details of the RX path that may be included in the RF device 2200, the RX path amplifier 2212 may include a low-noise amplifier (LNA). An input of the RX path amplifier 2212 may be coupled to an antenna port (not shown) of the antenna 2202, e.g., via the duplexer 2204. The RX path amplifier 2212 may amplify the RF signals received by the antenna 2202.

An output of the RX path amplifier 2212 may be coupled to an input of the RX path pre-mix filter 2214, which may be a harmonic or band-pass (e.g., low-pass) filter, configured to filter received RF signals that have been amplified by the RX path amplifier 2212.

An output of the RX path pre-mix filter 2214 may be coupled to an input of the RX path mixer 2216, also referred to as a downconverter. The RX path mixer 2216 may include two inputs and one output. A first input may be configured to receive the RX signals, which may be current signals, indicative of the signals received by the antenna 2202 (e.g., the first input may receive the output of the RX path pre-mix filter 2214). A second input may be configured to receive local oscillator signals from one of the local oscillators 2206. The RX path mixer 2216 may then mix the signals received at its two inputs to generate a downconverted RX signal, provided at an output of the RX path mixer 2216. As used herein, downconversion refers to a process of mixing a received RF signal with a local oscillator signal to generate a signal of a lower frequency. In particular, the TX path mixer (e.g., downconverter) 2216 may be configured to generate the sum and/or the difference frequency at the output port when two input frequencies are provided at the two input ports. In some embodiments, the RF device 2200 may implement a direct-conversion receiver (DCR), also known as homodyne, synchrodyne, or zero-IF receiver, in which case the RX path mixer 2216 may be configured to demodulate the incoming radio signals using local oscillator signals whose frequency is identical to, or very close to the carrier frequency of the radio signal. In other embodiments, the RF device 2200 may make use of downconversion to an intermediate frequency (IF). IFs may be used in superheterodyne radio receivers, in which a received RF signal is shifted to an IF before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2216 may include several such stages of IF conversion.

Although a single RX path mixer 2216 is shown in the RX path of FIG. 14, in some embodiments, the RX path mixer 2216 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2202 and an in-phase component of the local oscillator signal provided by the local oscillator 2206. The second RX path mixer may be configured for performing downconversion to generate a quadrature (Q) downconverted RX signal by mixing the RX signal received by the antenna 2202 and a quadrature component of the local oscillator signal provided by the local oscillator 2206 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2216 may, optionally, be coupled to the RX path post-mix filter 2218, which may be low-pass filters. In case the RX path mixer 2216 is a quadrature mixer that implements the first and second mixers as described above, the in-phase and quadrature components provided at the outputs of the first and second mixers respectively may be coupled to respective individual first and second RX path post-mix filters included in the filter 2218.

The ADC 2220 may be configured to convert the mixed RX signals from the RX path mixer 2216 from analog to digital domain. The ADC 2220 may be a quadrature ADC that, like the RX path quadrature mixer 2216, may include two ADCs, configured to digitize the downconverted RX path signals separated in in-phase and quadrature components. The output of the ADC 2220 may be provided to the digital processing unit 2208, configured to perform various functions related to digital processing of the RX signals so that information encoded in the RX signals can be extracted.

Turning to the details of the TX path that may be included in the RF device 2200, the digital signal to later be transmitted (TX signal) by the antenna 2202 may be provided, from the digital processing unit 2208, to the DAC 2230. Like the ADC 2220, the DAC 2230 may include two DACs, configured to convert, respectively, digital I- and Q-path TX signal components to analog form.

Optionally, the output of the DAC 2230 may be coupled to the TX path pre-mix filter 2228, which may be a bandpass (e.g., low-pass) filter (or a pair of band-pass, e.g., low-pass, filters, in case of quadrature processing) configured to filter out, from the analog TX signals output by the DAC 2230, the signal components outside of the desired band. The digital TX signals may then be provided to the TX path mixer 2226, which may also be referred to as an upconverter. Like the RX path mixer 2216, the TX path mixer 2226 may include a pair of TX path mixers, for in-phase and quadrature component mixing. Like the first and second RX path mixers that may be included in the RX path, each of the TX path mixers of the TX path mixer 2226 may include two inputs and one output. A first input may receive the TX signal components, converted to the analog form by the respective DAC 2230, which are to be upconverted to generate RF signals to be transmitted. The first TX path mixer may generate an in-phase (I) upconverted signal by mixing the TX signal component converted to analog form by the DAC 2230 with the in-phase component of the TX path local oscillator signal provided from the local oscillator 2206 (in various embodiments, the local oscillator 2206 may include a plurality of different local oscillators, or be configured to provide different local oscillator frequencies for the mixer 2216 in the RX path and the mixer 2226 in the TX path). The second TX path mixer may generate a quadrature phase (Q) upconverted signal by mixing the TX signal component converted to analog form by the DAC 2230 with the quadrature component of the TX path local oscillator signal. The output of the second TX path mixer may be added to the output of the first TX path mixer to create a real RF signal. A second input of each of the TX path mixers may be coupled the local oscillator 2206.

Optionally, the RF device 2200 may include the TX path post-mix filter 2224, configured to filter the output of the TX path mixer 2226.

The TX path amplifier 2222 may include one or more power amplifiers (PAs), e.g., an array of PAs.

In various embodiments, any of the RX path pre-mix filter 2214, the RX path post-mix filter 2218, the TX post-mix filter 2224, and the TX pre-mix filter 2228 may be implemented as RF filters. In some embodiments, an RF filter may be implemented as a plurality of RF filters, or a filter bank. A filter bank may include a plurality of RF filters that may be coupled to a switch, e. g., the RF switch 2234, configured to selectively switch any one of the plurality of RF filters on and off (e.g., activate any one of the plurality of RF filters), in order to achieve desired filtering characteristics of the filter bank (i.e., in order to program the filter bank). For example, such a filter bank may be used to switch between different RF frequency ranges when the RF device 2200 is, or is included in, a BS or in a UE device. In another example, such a filter bank may be programmable to suppress TX leakage on the different duplex distances.

The impedance tuner 2232 may include any suitable circuitry, configured to match the input and output impedances of the different RF circuitries to minimize signal losses in the RF device 2200. For example, the impedance tuner 2232 may include an antenna impedance tuner. Being able to tune the impedance of the antenna 2202 may be particularly advantageous because antenna's impedance is a function of the environment that the RF device 2200 is in, e.g., antenna's impedance changes depending on, e.g., if the antenna is held in a hand, placed on a car roof, etc.

As described above, the RF switch 2234 may be a device configured to route high-frequency signals through transmission paths, e.g., in order to selectively switch between a plurality of instances of any one of the components shown in FIG. 14, e.g., to achieve desired behavior and characteristics of the RF device 2200. For example, in some embodiments, an RF switch may be used to switch between different antennas 2202. In other embodiments, an RF switch may be used to switch between a plurality of RF filters (e.g., by selectively switching RF filters on and off) of the RF device 2200. Typically, an RF system would include a plurality of such RF switches.

The RF device 2200 provides a simplified version and, in further embodiments, other components not specifically shown in FIG. 14 may be included. For example, the RX path of the RF device 2200 may include a current-to-voltage amplifier between the RX path mixer 2216 and the ADC 2220, which may be configured to amplify and convert the downconverted signals to voltage signals. In another example, the RX path of the RF device 2200 may include a balun transformer for generating balanced signals. In yet another example, the RF device 2200 may further include a clock generator, which may, e.g., include a suitable phased-lock loop (PLL), configured to receive a reference clock signal and use it to generate a different clock signal that may then be used for timing the operation of the ADC 2220, the DAC 2230, and/or that may also be used by the local oscillator 2206 to generate the local oscillator signals to be used in the RX path or the TX path.

Example Data Processing System

FIG. 15 provides a block diagram illustrating an example data processing system 2300 that may be configured to implement, or control, at least portions of a log detector with noise compensation, according to some embodiments of the present disclosure. For example, the data processing system 2300 may be configured to implement or control portions of performing noise compensation in the log detector 1000 as shown in FIG. 10, or any further embodiments of the log detectors with noise compensation as described herein. In another example, the data processing system 2300 may be configured to implement at least portions of the control logic 2236, shown in FIG. 14.

As shown in FIG. 15, the data processing system 2300 may include at least one processor 2302, e.g., a hardware processor 2302, coupled to memory elements 2304 through a system bus 2306. As such, the data processing system may store program code within memory elements 2304. Further, the processor 2302 may execute the program code accessed from the memory elements 2304 via a system bus 2306. In one aspect, the data processing system may be implemented as a computer that is suitable for storing and/or executing program code. It should be appreciated, however, that the data processing system 2300 may be implemented in the form of any system including a processor and a memory that is capable of performing the functions described within this disclosure.

In some embodiments, the processor 2302 can execute software or an algorithm to perform the activities as discussed in the present disclosure, in particular activities related to log detectors with noise compensation as described herein. The processor 2302 may include any combination of hardware, software, or firmware providing programmable logic, including by way of non-limiting example a microprocessor, a digital signal processor (DSP), a field-programmable gate array (FPGA), a programmable logic array (PLA), an application specific integrated circuit (IC) (ASIC), or a virtual machine processor. The processor 2302 may be communicatively coupled to the memory element 2304, for example in a direct-memory access (DMA) configuration, so that the processor 2302 may read from or write to the memory elements 2304.

In general, the memory elements 2304 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 2300 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any elements illustrating log detectors with noise compensation, can also include suitable interfaces for receiving, transmitting, and/or otherwise communicating data or information in a network environment so that they can communicate with, e.g., the data processing system 2300.

In certain example implementations, mechanisms performing noise compensation in log detectors as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as the memory elements 2304 shown in FIG. 15, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as the processor 2302 shown in FIG. 15, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 2304 may include one or more physical memory devices such as, for example, local memory 2308 and one or more bulk storage devices 2310. The local memory may refer to RAM or other non-persistent memory device(s) generally used during actual execution of the program code. A bulk storage device may be implemented as a hard drive or other persistent data storage device. The processing system 2300 may also include one or more cache memories (not shown) that provide temporary storage of at least some program code in order to reduce the number of times program code must be retrieved from the bulk storage device 2310 during execution.

As shown in FIG. 15, the memory elements 2304 may store an application 2318. In various embodiments, the application 2318 may be stored in the local memory 2308, the one or more bulk storage devices 2310, or apart from the local memory and the bulk storage devices. It should be appreciated that the data processing system 2300 may further execute an operating system (not shown in FIG. 15) that can facilitate execution of the application 2318. The application 2318, being implemented in the form of executable program code, can be executed by the data processing system 2300, e.g., by the processor 2302. Responsive to executing the application, the data processing system 2300 may be configured to perform one or more operations or method steps described herein.

Input/output (I/O) devices depicted as an input device 2312 and an output device 2314, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 2314 may be any type of screen display, such as plasma display, liquid crystal display (LCD), organic light emitting diode (OLED) display, electroluminescent (EL) display, or any other indicator, such as a dial, barometer, or LEDs. In some implementations, the system may include a driver (not shown) for the output device 2314. Input and/or output devices 2312, 2314 may be coupled to the data processing system either directly or through intervening I/O controllers.

In an embodiment, the input and the output devices may be implemented as a combined input/output device (illustrated in FIG. 15 with a dashed line surrounding the input device 2312 and the output device 2314). An example of such a combined device is a touch sensitive display, also sometimes referred to as a "touch screen display" or simply "touch screen". In such an embodiment, input to the device may be provided by a movement of a physical object, such as a stylus or a finger of a user, on or near the touch screen display.

A network adapter 2316 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 2300, and a data transmitter for transmitting data from the data processing system 2300 to said systems, devices and/or networks. Modems, cable modems, and Ethernet cards are examples of different types of network adapter that may be used with the data processing system 2300.

Select Examples

The following paragraphs provide various select examples of the embodiments disclosed herein.

Example 1 provides a power detector (e.g., a log power detector) that includes a gain or attenuation circuit and a detector circuit. The gain or attenuation circuit includes a plurality of gain or attenuation elements arranged in a sequence, where each gain or attenuation element is configured to generate an output signal that is an amplified or attenuated version of an input signal provided thereto, and where each gain or attenuation element besides a first gain or attenuation element of the sequence is configured to receive the input signal that is based on the output of a previous gain or attenuation element in the sequence. The detector circuit comprising a plurality of detectors, each of the detectors configured to receive the output signal from a different one of the gain or attenuation elements and to generate a signal indicative of a power of the received output signal. In such a log power detector, the last detector is configured to receive a DC offset signal that is different from one or more DC offset signals received by one or more of other detectors of the plurality of detectors (some of the other detectors may not receive any DC offset signals, which is considered herein to be equivalent to such detectors receiving a zero DC offset signal), where the last detector is defines as the detector of the plurality of detectors that is configured to receive the output signal from the last gain or attenuation element of the sequence.

Example 2 provides the power detector according to example 1, where at least one of the other detectors is configured to not receive any DC offset signals.

Example 3 provides the power detector according to examples 1 or 2, where the DC offset signal is such that the last detector is associated with a bias voltage that is different from a bias voltage of the one or more of the other detectors.

Example 4 provides the power detector according to any one of the preceding examples, where each of the detectors includes a TTC including a first transistor, a second transistor, and a third transistor, and where the DC offset signal received by the last detector is provided to the third transistor of the TTC of the last detector.

Example 5 provides the power detector according to example 4, where the DC offset signal is configured to change a DC voltage at the base/gate terminal of the third transistor of the detector.

Example 6 provides the power detector according to example 5, where the DC offset signal received by the last detector is configured to change the DC voltage of the third transistor of the last detector based on a temperature.

Example 7 provides the power detector according to any one of examples 4-6, where each of the first, second, and third transistors includes a first terminal, a second terminal, and a third terminal, and where the DC offset signal received by the last detector is provided to the first terminal of the third transistor of the TTC of the last detector.

Example 8 provides the power detector according to example 7, where, for each of the plurality of detectors, the first terminal of the first transistor and the first terminal of the second transistor of the TTC of the detector are configured to receive respective portions of a differential input signal provided to the detector.

Example 9 provides the power detector according to any one of the preceding examples, where the plurality of gain or attenuation elements are arranged in a series configuration for generating progressively amplified or attenuated versions of the input signal provided to the first gain or attenuation element.

Example 10 provides the power detector according to any one of the preceding examples, where the plurality of gain or attenuation elements are arranged in a parallel configuration.

Example 11 provides the power detector according to any one of the preceding examples, further including a combiner, configured to combine the signals generated by the plurality of detectors to generate a signal representative of the input signal provided to the first gain or attenuation element of the sequence.

Example 12 provides the power detector according to example 11, where combining the signals includes adding the signals.

Example 13 provides the power detector according to any one of the preceding examples, where the DC offset signal is a current signal.

Example 14 provides a power detector (e.g., a log power detector) that includes a plurality of gain or attenuation elements arranged in series to generate a plurality of amplified or attenuated versions of an input signal, and further includes a plurality of detectors, each of the detectors configured to receive a different one of the plurality of amplified or attenuated versions of the input signal, where a DC offset voltage associated with one detector of the plurality of detectors is different from all DC offset voltages associated with one or more of other detectors of the plurality of detectors.

Example 15 provides the power detector according to example 14, where each of the detectors includes one or more TTCs, and where the DC offset voltage associated with one of the one or more TTCs of the one detector is different from all DC offset voltages associated with all TTCs of the one or more of other detectors.

Example 16 provides an RF system that includes a TX path, having an output coupled to an input of an antenna. The RF system further includes a power detector (e.g., a log power detector), coupled to the output of the TX path, and configured to measure a power of a signal at the output of the TX path. In some embodiments, the power detector may be a log power detector according to any of the preceding examples. In some embodiments, the power detector may be configured to measure a power of a signal at an output of the TX path, the power detector including a plurality of detectors, where each of the detectors is configured to receive an output signal from a different one of a sequence of gain or attenuation elements and to generate a signal indicative of a power of the received output signal, and where the detector that is to receive the output signal from the last gain or attenuation element of the sequence is to receive a DC offset signal that is different from one or more DC offset signals received by one or more of other detectors of the plurality of detectors.

Example 17 provides the RF system according to example 16, where the DC offset signal received by the last detector is based on a temperature of at least a portion of the detector circuit.

Example 18 provides the RF system according to example 16, further including the antenna.

Example 19 provides the RF system according to example 16, where the RF system is a base station.

Example 20 provides the RF system according to example 16, where the RF system is a user equipment device.

Other Implementation Notes, Variations, and Applications

In the discussions of the embodiments above, components of a system, such as transistors, amplifiers, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to log detectors with noise compensation as described herein.

In one example embodiment, any number of electrical circuits of the present drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present drawings may be implemented as stand-alone modules (e.g., a device with associated components and circuitry configured to perform a specific application or function) or implemented as plug-in modules into application specific hardware of electronic devices. Note that particular embodiments of the present disclosure may be readily included in a SOC package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components illustrated in FIG. 10) have only been offered for purposes of example and teaching only. Such information may be varied considerably without departing from the spirit of the present disclosure. It should be appreciated that the system can be consolidated in any suitable manner. Along similar design alternatives, any of the illustrated circuits, components, modules, and elements of the present drawings may be combined in various possible configurations, all of which are clearly within the broad scope of this specification. In the foregoing description, example embodiments have been described with reference to particular component arrangements. Various modifications and changes may be made to such embodiments without departing from the scope of the present disclosure. The description and drawings are, accordingly, to be regarded in an illustrative rather than in a restrictive sense.

The invention claimed is:

1. A power detector, comprising:
    a gain or attenuation circuit comprising a plurality of gain or attenuation elements arranged in a sequence, where each gain or attenuation element is to generate an output signal that is an amplified or attenuated version of an input signal provided thereto, and where each gain or attenuation element besides a first gain or attenuation element of the sequence is to receive the input signal that is based on the output of a previous gain or attenuation element in the sequence; and
    a detector circuit comprising a plurality of detectors, each of the detectors to receive the output signal from a different one of the gain or attenuation elements and to generate a signal indicative of a power of the received output signal,
    wherein a last detector is to receive a DC offset signal that is different from one or more DC offset signals received by one or more of other detectors of the plurality of detectors, where the last detector is a detector of the plurality of detectors that is to receive the output signal from a last gain or attenuation element of the sequence.

2. The power detector according to claim 1, wherein at least one of the other detectors is to not receive any DC offset signals.

3. The power detector according to claim 1, wherein the DC offset signal is such that the last detector is associated with a bias voltage that is different from a bias voltage of the one or more of the other detectors.

4. The power detector according to claim 1, wherein:
    each of the detectors includes a triple-tail cell (TTC) comprising a first transistor, a second transistor, and a third transistor, and
    the DC offset signal received by the last detector is provided to the third transistor of the TTC of the last detector.

5. The power detector according to claim 4, wherein the DC offset signal is to change a DC voltage of the third transistor of the detector.

6. The power detector according to claim 5, wherein the DC offset signal received by the last detector is to change the DC voltage of the third transistor of the last detector based on a temperature.

7. The power detector according to claim 4, wherein:
each of the first, second, and third transistors includes a first terminal, a second terminal, and a third terminal, and
the DC offset signal received by the last detector is provided to the first terminal of the third transistor of the TTC of the last detector.

8. The power detector according to claim 7, wherein, for each of the plurality of detectors, the first terminal of the first transistor and the first terminal of the second transistor of the TTC of the detector are to receive respective portions of a differential input signal provided to the detector.

9. The power detector according to claim 1, wherein the plurality of gain or attenuation elements are arranged in a series configuration for generating progressively amplified or attenuated versions of the input signal provided to the first gain or attenuation element.

10. The power detector according to claim 1, wherein the plurality of gain or attenuation elements are arranged in a parallel configuration.

11. The power detector according to claim 1, further comprising a combiner, to combine the signals generated by the plurality of detectors to generate a signal representative of the input signal provided to the first gain or attenuation element of the sequence.

12. The power detector according to claim 11, wherein combining the signals includes adding the signals.

13. The power detector according to claim 1, wherein the DC offset signal is a current signal.

14. A power detector, comprising:
a plurality of gain or attenuation elements arranged in series to generate a plurality of amplified or attenuated versions of an input signal; and
a plurality of detectors, each of the detectors to receive a different one of the plurality of amplified or attenuated versions of the input signal,
wherein a DC offset voltage associated with one detector of the plurality of detectors is different from all DC offset voltages associated with one or more of other detectors of the plurality of detectors.

15. The power detector according to claim 14, wherein:
each of the detectors includes one or more triple-tail cells (TTCs), and
the DC offset voltage associated with one of the one or more TTCs of the one detector is different from all DC offset voltages associated with all TTCs of the one or more of other detectors.

16. A radio frequency (RF) system, comprising:
a transmit (TX) path, having an output coupled to an input of an antenna; and
a power detector, to measure a power of a signal at an output of the TX path, the power detector including a plurality of detectors, each of the detectors to receive an output signal from a different one of a sequence of gain or attenuation elements and to generate a signal indicative of a power of the received output signal,
wherein a detector, of the plurality of detectors, that is to receive the output signal from the last gain or attenuation element of the sequence is to receive a DC offset signal that is different from one or more DC offset signals received by one or more of other detectors of the plurality of detectors.

17. The RF system according to claim 16, wherein the DC offset signal received by the last detector is based on a temperature of at least a portion of the power detector.

18. The RF system according to claim 16, further comprising the antenna.

19. The RF system according to claim 16, wherein the RF system is a base station.

20. The RF system according to claim 16, wherein the RF system is a user equipment device.

* * * * *